US012795932B2

(12) United States Patent
Yamashita et al.

(10) Patent No.: US 12,795,932 B2
(45) Date of Patent: Nov. 10, 2026

(54) SEMICONDUCTOR DEVICE AND MANUFACTURING METHOD THEREOF

(71) Applicant: Kioxia Corporation, Tokyo (JP)

(72) Inventors: Hiroyuki Yamashita, Yokkaichi Mie (JP); Tatsunori Isogai, Yokkaichi Mie (JP); Masaki Noguchi, Yokkaichi Mie (JP); Junichi Kaneyama, Yokkaichi Mie (JP); Shin Ishimatsu, Yokkaichi Mie (JP); Daisuke Nishida, Mie Mie (JP); Tomoyuki Takemoto, Nagoya Aichi (JP); Wataru Matsuura, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 419 days.

(21) Appl. No.: 18/593,379

(22) Filed: Mar. 1, 2024

(65) Prior Publication Data

US 2024/0324227 A1 Sep. 26, 2024

(30) Foreign Application Priority Data

Mar. 22, 2023 (JP) ................................ 2023-045519

(51) Int. Cl.
*H10B 43/35* (2023.01)
*H10B 43/27* (2023.01)

(52) U.S. Cl.
CPC ............ *H10B 43/35* (2023.02); *H10B 43/27* (2023.02)

(58) Field of Classification Search
CPC ................................ H10B 43/27; H10B 43/35
See application file for complete search history.

(56) References Cited

U.S. PATENT DOCUMENTS 10,020,317 B2 7/2018 Zhang et al.
10,720,444 B2 7/2020 Nishikawa et al.
11,309,322 B2 4/2022 Fujitsuka et al.
11,342,468 B2 * 5/2022 Noguchi ................ H10B 43/27
2003/0222318 A1 12/2003 Tanaka et al.
(Continued)

FOREIGN PATENT DOCUMENTS

JP 2003-347543 A 12/2003
JP 2004-363329 A 12/2004
(Continued)

*Primary Examiner* — Steven M Page
(74) *Attorney, Agent, or Firm* — Foley & Lardner LLP

(57) ABSTRACT

A semiconductor device includes a stack including a conductor layer and an insulator layer, a block insulating layer, a channel layer, a charge storage layer provided between the block insulating layer and the channel layer, and a tunnel layer provided between the charge storage layer and the channel layer, where the charge storage layer includes a first charge storage layer containing Si, N and at least one of Al, Mo, Nb, Hf, Zr, Ti, B, or P, a second charge storage layer containing Si and N, in which Si is contained at a second concentration higher than a first concentration that is a concentration of Si in the first charge storage layer, and provided between the first charge storage layer and the tunnel layer, and a dielectric layer containing at least one of silicon oxynitride (SiON), silicon oxycarbonitride (SiOCN), or aluminum oxide (AlOx), and provided between the first charge storage layer and the second charge storage layer.

18 Claims, 19 Drawing Sheets

(56) References Cited

U.S. PATENT DOCUMENTS

| | | | | |
|---|---|---|---|---|
| 2005/0006696 | A1 | 1/2005 | Noguchi et al. | |
| 2008/0087937 | A1 | 4/2008 | Akahori et al. | |
| 2008/0237697 | A1 | 10/2008 | Shimizu et al. | |
| 2009/0267134 | A1 | 10/2009 | Koike et al. | |
| 2013/0248965 | A1 | 9/2013 | Nakai et al. | |
| 2013/0264626 | A1 | 10/2013 | Sawa | |
| 2020/0279957 | A1* | 9/2020 | Noguchi ................ | H10B 43/27 |
| 2021/0296354 | A1* | 9/2021 | Uchiyama .............. | H10B 43/27 |
| 2022/0302160 | A1* | 9/2022 | Yamashita ............. | H10B 41/27 |
| 2022/0351777 | A1* | 11/2022 | Maejima ................ | G11C 16/08 |

FOREIGN PATENT DOCUMENTS

| | | | |
|---|---|---|---|
| JP | 2008-098510 | A | 4/2008 |
| JP | 2008-244243 | A | 10/2008 |
| JP | 2009-231373 | A | 10/2009 |
| JP | 2013-197546 | A | 9/2013 |
| JP | 2013-219239 | A | 10/2013 |
| JP | 2019-009259 | A | 1/2019 |
| JP | 6669581 | B2 | 3/2020 |
| JP | 2020-155482 | A | 9/2020 |
| JP | 2022-143476 | A | 10/2022 |

* cited by examiner

SEMICONDUCTOR DEVICE AND MANUFACTURING METHOD THEREOF

CROSS-REFERENCE TO RELATED APPLICATION

This application is based upon and claims the benefit of priority from Japanese Patent Application No. 2023-045519, filed Mar. 22, 2023, the entire contents of which are incorporated herein by reference.

FIELD

Embodiments described herein relate generally to a semiconductor device and a manufacturing method thereof.

BACKGROUND

A semiconductor device such as a NAND-type flash memory having a three-dimensional structure in which a plurality of insulating layers and a plurality of metal layers are stacked is proposed. In the semiconductor device, improvement in characteristics such as writing and erasing is desired.

DETAILED DESCRIPTION

Figure 1:
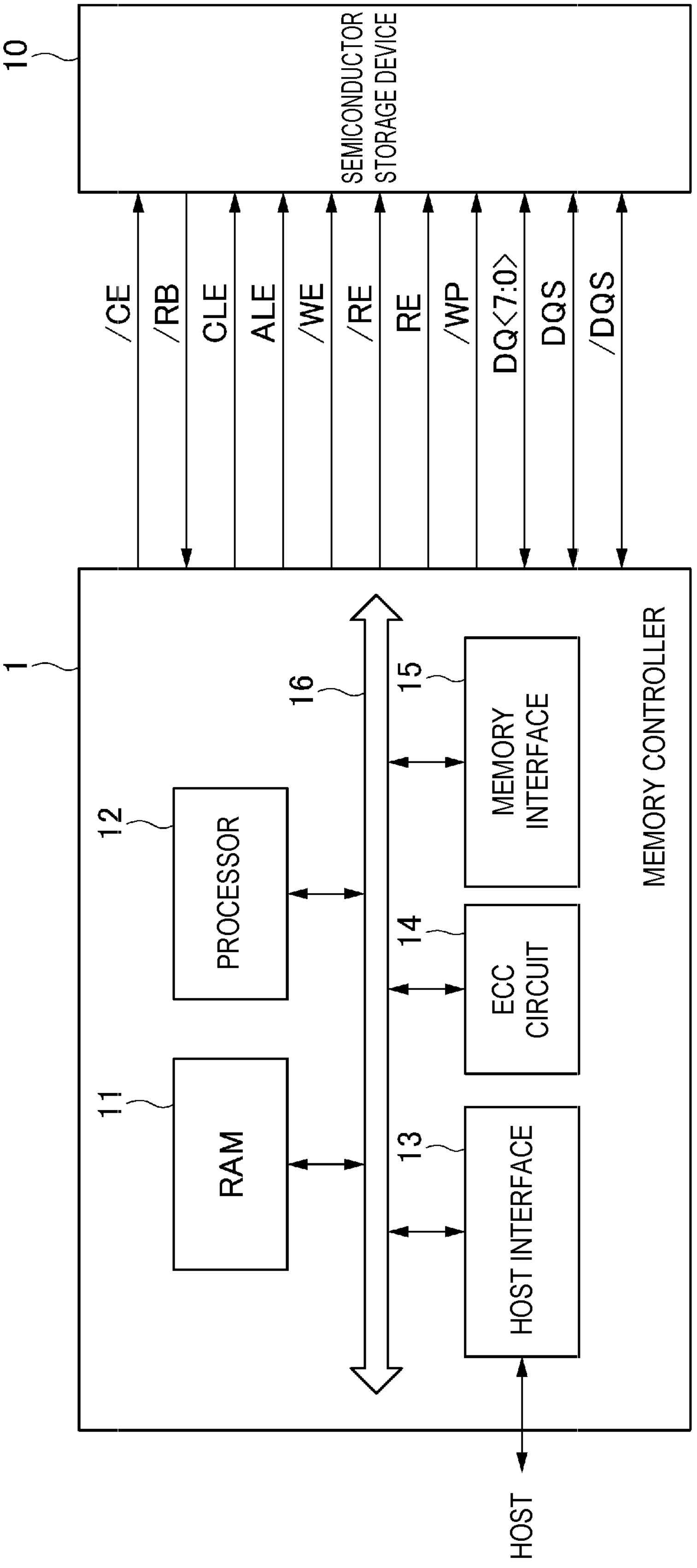
FIG. 1 is a block diagram showing a schematic configuration of a memory system according to an embodiment.

Embodiments provide a semiconductor device capable of improving characteristics such as writing and erasing.

In general, according to one embodiment, a semiconductor device includes a stack including a conductor layer and an insulator layer alternately stacked, a block insulating layer provided along a side surface of the stack, a channel layer, a charge storage layer provided between the block insulating layer and the channel layer, and a tunnel layer provided between the charge storage layer and the channel layer, where the charge storage layer includes a first charge storage layer containing Si, N and at least one of Al, Mo, Nb, Hf, Zr, Ti, B, or P, a second charge storage layer containing Si and N, in which Si is contained at a second concentration higher than a first concentration that is a concentration of Si in the first charge storage layer, and provided between the first charge storage layer and the tunnel layer, and a dielectric layer containing O and provided between the first charge storage layer and the second charge storage layer.

Hereinafter, the present embodiment will be described with reference to the drawings. In order to facilitate understanding of the description, the same elements are designated by the same reference numerals as much as possible in each drawing, and duplicate description is omitted.

The semiconductor device 10 according to the embodiment of the present disclosure may be used as a semiconductor storage device and is also referred to as a semiconductor storage device 10 in the following description. In order to facilitate understanding of the description, the same elements are designated by the same reference numerals as much as possible in each drawing, and duplicate description is omitted. In addition, in the following description, each drawing may show an X-axis, a Y-axis, and a Z-axis. The X-axis, the Y-axis, and the Z-axis form a three-dimensional right-handed orthogonal coordinate. Hereinafter, the arrow direction of the X-axis may be referred to as the X-axis front, and the direction opposite to the arrow may be referred to as the X-axis rear. The same applies to the other axes. The Z-axis front and the Z-axis rear may be referred to as "upper side" to "upper" and "lower side" to "lower", respectively. In addition, the Z-axis direction may also be referred to as a "stacking direction". In addition, a plane orthogonal to each of the X-axis, the Y-axis, or the Z-axis may be referred to as a YZ plane, a ZX plane, or an XY plane, respectively. Meanwhile, these directions and the like are used for convenience to describe the relative positional relationship. Therefore, these directions do not define an absolute positional relationship.

Embodiment

Configuration of Memory System

As shown in FIG. 1, the memory system according to the present embodiment includes a memory controller 1 and a semiconductor device 10. The semiconductor device 10 is a non-volatile storage device configured as a NAND flash memory. The memory system may be connected to a host. The host is, for example, an electronic device such as a personal computer or a mobile terminal. Only one semiconductor device 10 is shown in FIG. 1, but a plurality of semiconductor devices 10 may be provided in a memory system.

The memory controller 1 controls writing of data to the semiconductor device 10 according to a write request from the host. Further, the memory controller 1 controls reading of data from the semiconductor device 10 according to a read request from the host.

Between the memory controller 1 and the semiconductor device 10, each signal of a chip enable signal/CE, a ready busy signal/RB, a command latch enable signal CLE, an address latch enable signal ALE, a write enable signal/WE, read enable signals RE and/RE, a write protect signal/WP, a data signal DQ<7:0>, data strobe signals DOS and/DQS are communicated.

The chip enable signal/CE is a signal for enabling the semiconductor device 10. The ready busy signal/RB is a signal for indicating whether the semiconductor device 10 is in a ready state or a busy state. The "ready state" is a state in which an external command is received. The "busy state" is a state in which an external command is not received. The command latch enable signal CLE is a signal indicating that the signal DQ<7:0> is a command. The address latch enable signal ALE is a signal indicating that the signal DQ<7:0> is an address. The write enable signal/WE is a signal for taking the received signal into the semiconductor device 10 and is asserted each time the memory controller 1 receives a command, an address, and data. The memory controller 1 instructs the semiconductor device 10 to take the signal DQ<7:0> while the signal/WE is at an "L (Low)" level.

The read enable signals RE and/RE are signals for the memory controller 1 to read data from the semiconductor device 10. The read enable signals RE and/RE are used, for example, to control the operation timing of the semiconductor device 10 when outputting the signal DQ<7:0>. The write protect signal/WP is a signal for instructing the semiconductor device 10 to perform data write and erasing protection. The signal DQ<7:0> is an entity of data communicated between the semiconductor device 10 and the memory controller 1, and include commands, addresses, and data. The data strobe signals DQS and/DQS are signals for controlling the input/output timing of the signal DQ<7:0>.

The memory controller 1 includes a RAM 11, a processor 12, a host interface 13, an ECC circuit 14, and a memory interface 15. The RAM 11, the processor 12, the host interface 13, the ECC circuit 14, and the memory interface 15 are connected to each other via an internal bus 16.

The host interface 13 outputs the request received from the host, user data (write data), and the like to the internal bus 16. Further, the host interface 13 transmits the user data read from the semiconductor device 10, the response from the processor 12, and the like to the host.

The memory interface 15 controls a process of writing user data and the like to the semiconductor device 10 and a process of reading the user data from the semiconductor device 10 based on the instruction of the processor 12.

The processor 12 controls the memory controller 1 in an integrated manner. The processor 12 is, for example, a CPU, an MPU, or the like. When receiving a request from the host via the host interface 13, the processor 12 controls in response to the request. For example, the processor 12 instructs the memory interface 15 to write the user data and parity to the semiconductor device 10 according to the request from the host. Further, the processor 12 instructs the memory interface 15 to read the user data and the parity from the semiconductor device 10 according to the request from the host.

The processor 12 determines a storage area (a memory area) on the semiconductor device 10 with respect to the user data stored in the RAM 11. The user data is stored in the RAM 11 via the internal bus 16. The processor 12 performs determination of the memory area with respect to data in page units (page data), which is the unit of writing. The user data, which is stored on one page of the semiconductor device 10, is hereinafter also referred to as "unit data". The unit data is generally encoded by adding a correction code and is stored in the semiconductor device 10 as a codeword. The encoding is not essential in the present embodiment. The memory controller 1 may store the unit data in the semiconductor device 10 without encoding, and FIG. 1 shows a configuration in which encoding is performed as an example. When the memory controller 1 does not perform encoding, the page data will match the unit data. Further, one codeword may be generated based on one unit data, or one codeword may be generated based on divided data obtained by dividing unit data. Also, one codeword may be generated using a plurality of pieces of unit data.

The processor 12 determines the memory area of the semiconductor device 10 to be written for each unit data. A physical address is assigned to the memory areas of the semiconductor device 10. The processor 12 manages the memory area to which unit data is written using physical addresses. The processor 12 specifies the determined memory area (physical address) and instructs the memory interface 15 to write user data to the semiconductor device 10. The processor 12 manages correspondence between logical addresses of user data (logical addresses managed by the host) and physical addresses. When receiving a read request including a logical address from the host, the processor 12 identifies the physical address corresponding to the logical address, specifies the physical address, and instructs the memory interface 15 to read user data.

The ECC circuit 14 encodes the user data stored in the RAM 11 to generate a codeword. Further, the ECC circuit 14 decodes the codeword read from the semiconductor device 10.

The RAM 11 temporarily stores user data, which is received from host, until the user data is stored in the semiconductor device 10, or temporarily stores data, which is read from the semiconductor device 10, until the read data is transmitted to the host. The RAM 11 is a general-purpose memory such as an SRAM or a DRAM.

FIG. 1 shows a configuration example in which the memory controller 1 includes each of the ECC circuit 14 and the memory interface 15. Meanwhile, the ECC circuit 14 may be built into the memory interface 15. Further, the ECC circuit 14 may be built in the semiconductor device 10. The specific configuration and disposition of each element shown in FIG. 1 are not particularly limited.

When a write request is received from the host, the memory system in FIG. 1 operates as follows. The processor 12 temporarily stores the data to be written in the RAM 11. The processor 12 reads data stored in the RAM 11 to input the data to the ECC circuit 14. The ECC circuit 14 encodes the input data and inputs the codeword to the memory interface 15. The memory interface 15 writes the input codeword to the semiconductor device 10.

When a read request is received from the host, the memory system in FIG. 1 operates as follows. The memory interface 15 inputs the codeword read from the semiconductor device 10 to the ECC circuit 14. The ECC circuit 14 decodes the input codeword to store the decoded data in the RAM 11. The processor 12 transmits data stored in the RAM 11 to the host via the host interface 13.

Configuration of Semiconductor Device

Figure 2:
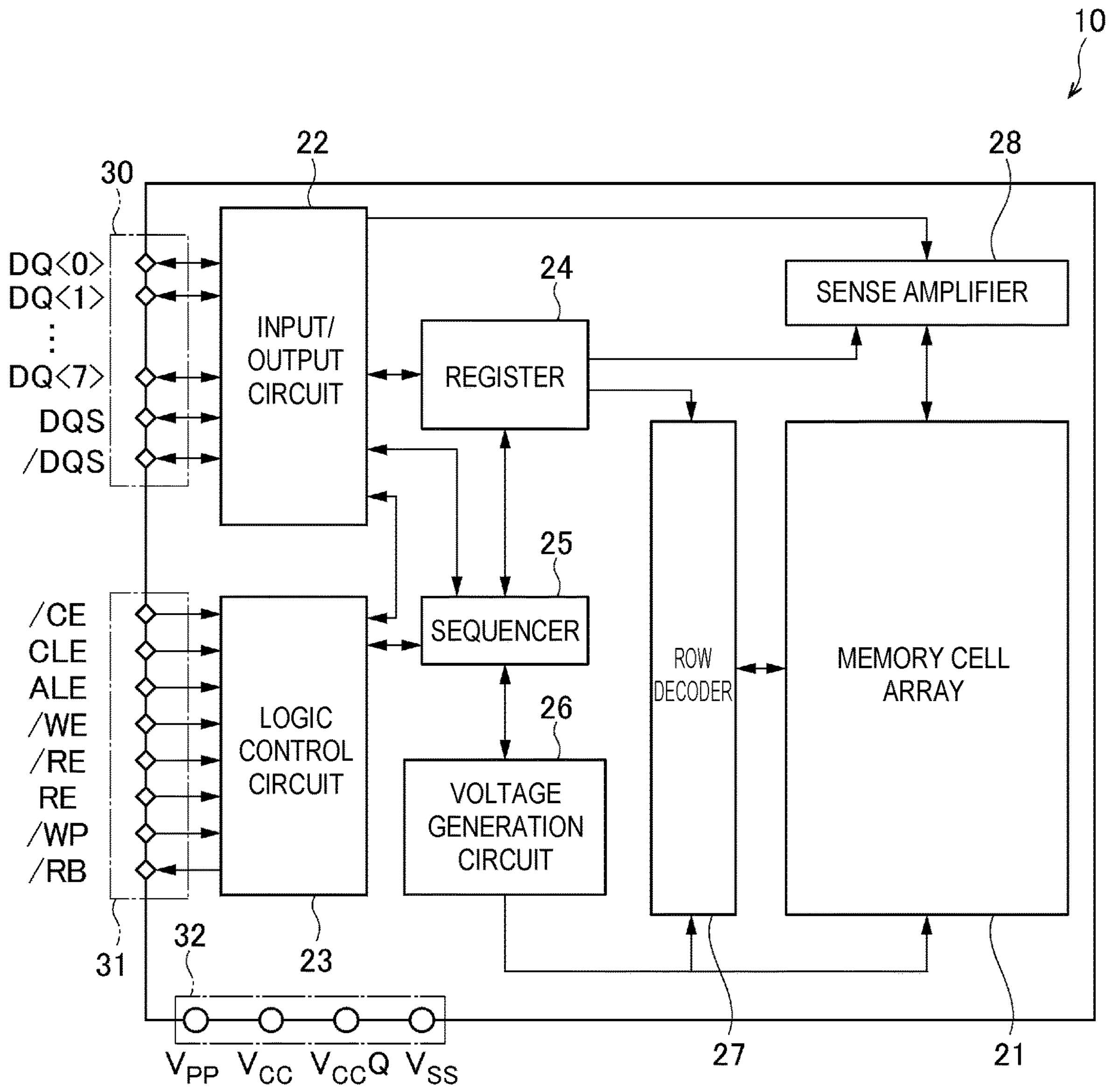
FIG. 2 is a block diagram showing a schematic configuration of a semiconductor device according to the embodiment.

As shown in FIG. 2, the semiconductor device 10 of the embodiment includes a memory cell array 21, an input/output circuit 22, a logic control circuit 23, a register 24, a sequencer 25, a voltage generation circuit 26, a row decoder 27, a sense amplifier 28, an input/output pad group 30, a logic control pad group 31, and a power input terminal group 32.

The memory cell array 21 is a portion for storing data. The memory cell array 21 is configured to have a plurality of memory cell transistors associated with a plurality of bit lines and a plurality of word lines.

The input/output circuit 22 communicates the signal DQ<7:0>, and the data strobe signals DOS, /DQS with the memory controller 1. Further, the input/output circuit 22 transfers a command and an address in the signal DQ<7:0> to the register 24. Further, the input/output circuit 22 communicates write data and read data with the sense amplifier 28.

The logic control circuit 23 receives control signals such as the chip enable signal/CE, the command latch enable signal CLE, the address latch enable signal ALE, the write enable signal/WE, the read enable signals RE and/RE, and the write protect signal/WP from the memory controller 1. Further, the logic control circuit 23 transfers the ready busy signal/RB to the memory controller 1 to transmit the state of the semiconductor device 10 to the outside.

The register 24 temporarily latches various data. For example, the register 24 latches commands for instructing a write operation, a read operation, an erasing operation, and the like. This command is input from the memory controller 1 to the input/output circuit 22, and then transferred from the input/output circuit 22 to the register 24 and latched. The register 24 also latches the address corresponding to the above command. This address is input from the memory controller 1 to the input/output circuit 22, and then transferred from the input/output circuit 22 to the register 24 and latched. Further, the register 24 also latches the status information indicating the operation state of the semiconductor device 10. The status information is updated by the sequencer 25 each time according to the operation state of the memory cell array 21 and the like. The status information is output from the input/output circuit 22 to the memory controller 1 as a state signal in response to the request from the memory controller 1.

The sequencer 25 controls the operation of each portion including the memory cell array 21 based on the control signals input from the memory controller 1 to the input/output circuit 22 and the logic control circuit 23.

The voltage generation circuit 26 is a portion that generates the voltage required for each of the data write operation, read operation, and erasing operation in the memory cell array 21. This voltage includes, for example, a voltage applied to a plurality of word lines and a plurality of bit lines of the memory cell array 21, respectively. The operation of the voltage generation circuit 26 is controlled by the sequencer 25.

The row decoder 27 is a circuit including a group of switches for applying a voltage to each of a plurality of word lines of the memory cell array 21. The row decoder 27 receives a block address and a row address from the register 24, selects a block based on the block address, and selects a word line based on the row address. The row decoder 27 switches the open/closed state of the group of switches so that the voltage from the voltage generation circuit 26 is applied to the selected word line. The operation of the row decoder 27 is controlled by the sequencer 25.

The sense amplifier 28 is a circuit for adjusting the voltage applied to the bit line of the memory cell array 21 or reading the voltage of the bit line and converting the read voltage into data. At the time of reading the data, the sense amplifier 28 acquires the data read from the memory cell transistor of the memory cell array 21 to the bit line, and transfers the acquired read data to the input/output circuit 22. When writing data, the sense amplifier 28 transfers the data written via the bit line to the memory cell transistor. The operation of the sense amplifier 28 is controlled by the sequencer 25.

The input/output pad group 30 is a portion provided with a plurality of terminals (pads) for communicating each signal between the memory controller 1 and the input/output circuit 22. Each terminal is individually provided corresponding to each of the signal DQ<7:0> and the data strobe signals DQS and/DQS.

The logic control pad group 31 is a portion provided with a plurality of terminals for communicating each signal between the memory controller 1 and the logic control circuit 23. Each terminal is individually provided corresponding to the chip enable signal/CE, the command latch enable signal CLE, the address latch enable signal ALE, the write enable signal/WE, the read enable signals RE and/RE, the write protect signal/WP, and the ready busy signal/RB.

The power input terminal group 32 is a portion provided with a plurality of terminals for receiving each necessary voltage to be applied for the operation of the semiconductor device 10. The voltage applied to each terminal includes power supply voltages Vcc, VccQ, Vpp, and a ground voltage Vss. The power supply voltage Vcc is a circuit power supply voltage supplied from the outside as an operation power supply, and is, for example, a voltage of about 3.3 V. The power supply voltage VccQ is, for example, a voltage of 1.2V. The power supply voltage VccQ is a voltage used when communicating signals between the memory controller 1 and the semiconductor device 10. The power supply voltage Vpp is a power supply voltage higher than the power supply voltage Vcc, and for example, is a voltage of 12 V.

Electronic Circuit Configuration of Memory Cell Array

Figure 3:
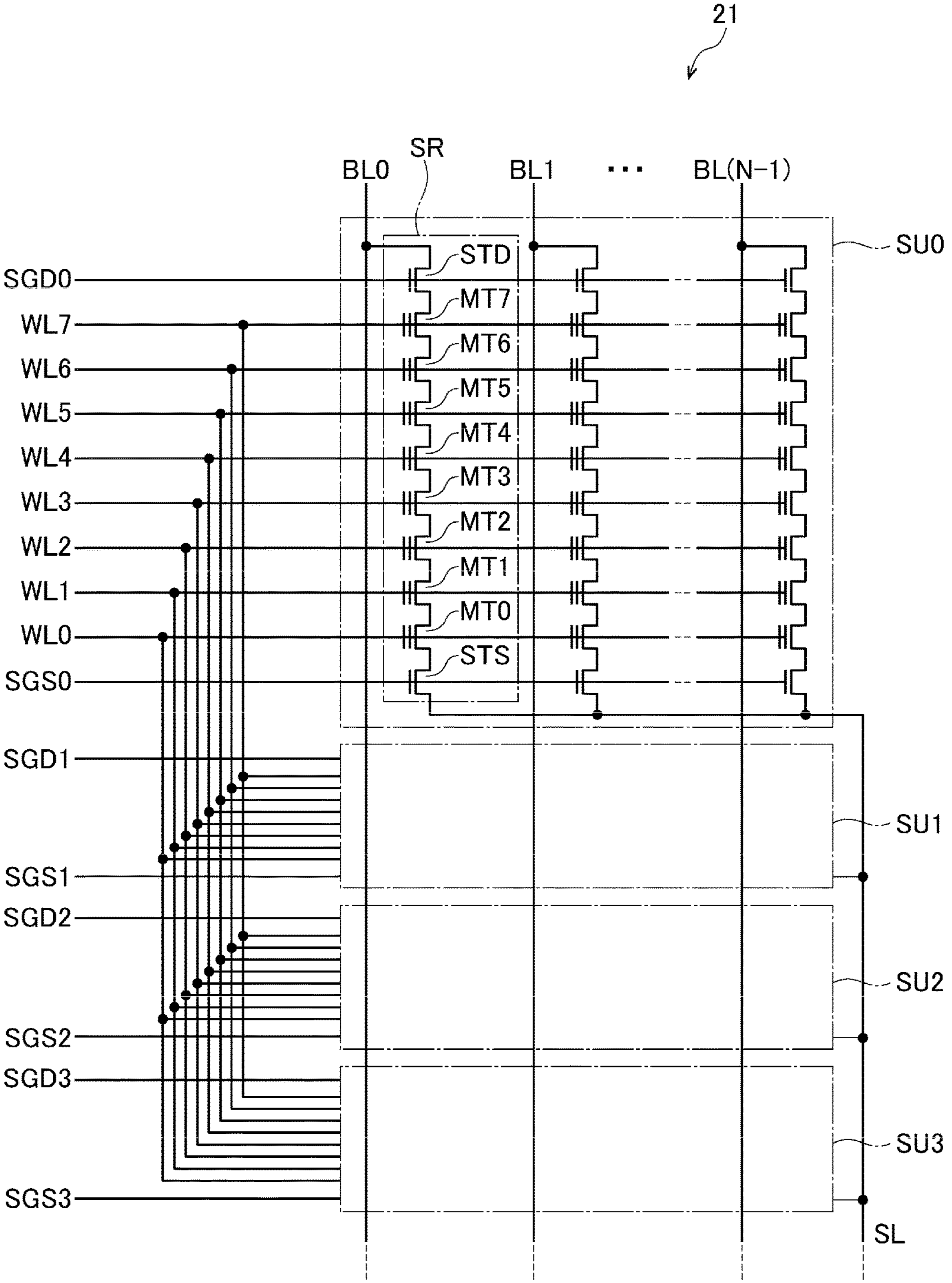
FIG. 3 is a circuit diagram showing an equivalent circuit of the semiconductor device of the embodiment.

Next, the electrical circuit configuration of the memory cell array 21 will be described. As shown in FIG. 3, the memory cell array 21 has a plurality of string units SU0 to SU3. Each of the string units SU0 to SU3 has a plurality of NAND strings SR. Each NAND string SR has, for example, eight memory cell transistors MT0 to MT7 and two select transistors STD and STS. The number of memory cell transistors and the number of select transistors provided in the NAND string SR may be optionally changed.

The plurality of string units SU0 to SU3 configure one block as a whole. In FIG. 3, only a single block is shown, but in reality, a plurality of such blocks are provided in the memory cell array 21.

Hereinafter, the string units SU0 to SU3 will also be referred to as a "string unit SU" without distinguishing each of the string units SU0 to SU3. In addition, the memory cell transistors MT0 to MT7 will also be referred to as a "memory cell transistor MT" without distinguishing each of the memory cell transistors MT0 to MT7.

The memory cell array 21 has N-bit lines BL0 to BL (N−1). It should be noted that "N" is a positive integer. Each string unit SU has N NAND strings SR, which are the same number as the number N of the bit lines BL0 to BL (N−1). The memory cell transistors MT0 to MT7 provided in the NAND string SR are disposed in series between the source of the select transistor STD and the drain of the select transistor STS. The drain of the select transistor STD is connected to any of the plurality of bit lines BL0 to BL (N−1). The source of the select transistor STS is connected to a source line SL. In the following description, the bit lines BL0 to BL (N−1) will also be referred to as a "bit line BL" without being distinguished from each other.

Each memory cell transistor MT is configured as a transistor having a charge storage layer in a gate portion. The amount of charge stored in the charge storage layer corresponds to the data latched in the memory cell transistor MT. The memory cell transistor MT may be, for example, a charge trap type using a silicon nitride film or the like as the charge storage layer, or a floating gate type using a silicon film or the like as the charge storage layer.

Gates of the plurality of select transistors STD provided in the string unit SU0 are all connected to the select gate line SGD0. A voltage for switching the on and off of each select transistor STD is applied to the select gate line SGD0. The string units SU1 to SU3 are also connected to the select gate lines SGD1 to SGD3 in the same manner.

The gates of the plurality of select transistors STS provided in the string unit SU0 are all connected to the select gate line SGS0. A voltage for switching the on and off of each select transistor STS is applied to the select gate line SGS0. The string units SU1 to SU3 are also connected to the select gate lines SGS1 to SGS3 in the same manner. The select gate line may be shared in the string units SU0 to SU3 configuring one block, and the gates of the select transistors STS of each of the string units SU0 to SU3 may be connected to the common select gate line.

Each of gates of the memory cell transistors MT0 to MT7 is connected to the word lines WL0 to WL7. The word lines WL0 to WL7 are applied with a voltage for the purpose of switching the on and off of the memory cell transistors MT0 to MT7, changing the amount of charge stored in each charge storage layer of the memory cell transistors MT0 to MT7, and the like.

Writing and reading of data in the semiconductor device 10 are collectively performed for a plurality of memory cell transistors MT connected to any word line WL in any string unit SU for each unit referred to as a "page". On the other hand, the data erasure in the semiconductor device 10 is collectively performed on all the memory cell transistors MT provided in the block. As a specific method for performing writing, reading, and erasing of such data, it is possible to adopt various known methods, and thus a detailed description thereof will be omitted.

Structure of Semiconductor Device

Figure 4:
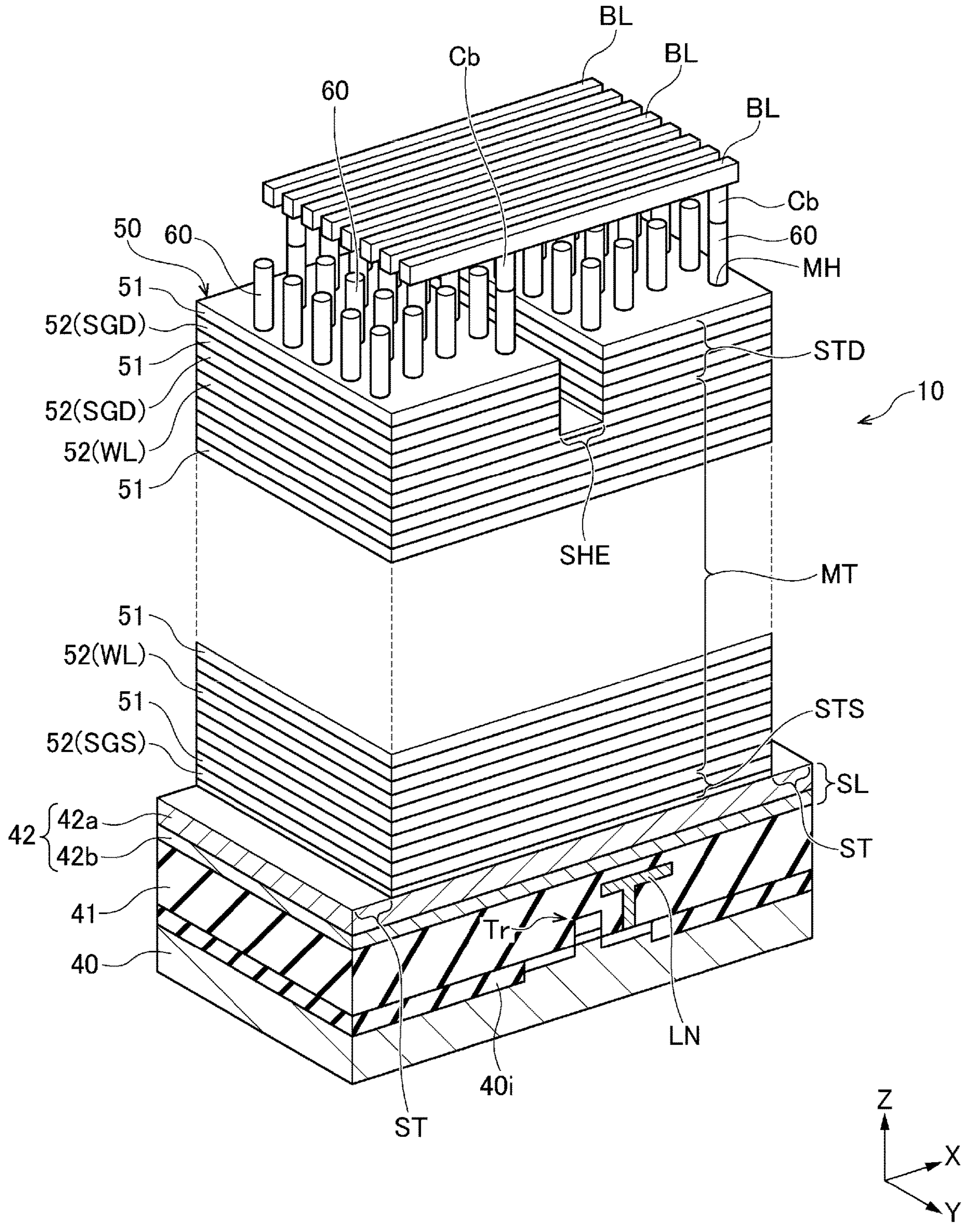
FIG. 4 is a perspective view showing a cross-sectional perspective structure of the semiconductor device of the embodiment.

Next, the structure of the semiconductor device 10, particularly the structure in the vicinity of the memory cell array 21 will be specifically described. As shown in FIG. 4, the semiconductor device 10 includes a substrate 40, an insulator layer 41, a semiconductor layer 42, and a stack 50.

The substrate 40 is a plate-like member having a flat surface on the Z-axis direction side. The substrate 40 is, for example, a silicon wafer. The insulator layer 41 and the semiconductor layer 42 are formed on the upper surface of the substrate 40 as multi-layer films by, for example, chemical vapor deposition (CVD) film formation. For example, an element separation region 40*i* is provided on the surface of the substrate (semiconductor substrate) 40. The element separation region 40*i* is, for example, an insulating region including silicon oxide, and is a portion that defines a source region and a drain region of the transistor Tr.

The insulator layer 41 is formed of an insulating material such as silicon oxide. A peripheral circuit including, for example, a transistor Tr and a wiring LN or the like is formed in a bottom portion in contact with the substrate 40 of the insulator layer 41. The peripheral circuit configures a sense amplifier 28, a row decoder 27, and the like shown in FIG. 2. The insulator layer 41 covers the entire peripheral circuit.

The semiconductor layer 42 is a layer that functions as a source line SL in FIG. 3. The semiconductor layer 42 is formed of a material including silicon, such as polycrystalline silicon doped with an impurity, for example. The semiconductor layer 42 is embedded in the insulator layer 41 below the memory cell array 21.

The semiconductor layer 42 may be formed of a semiconductor material such as silicon as a whole, but may be formed of a stacked structure of at least two layers including a semiconductor layer 42*a* and a conductive layer 42*b* as shown in FIG. 4. The semiconductor layer 42*a* is formed of a semiconductor material such as silicon (polysilicon), for example. The conductive layer 42*b* is formed of a metal material such as tungsten, for example.

The stack 50 is provided on the upper surface of the semiconductor layer 42. The stack 50 has a structure in which a plurality of insulator layers 51 and a plurality of conductor layers 52 are alternately stacked in the Z-axis direction. The insulator layer 51 and the conductor layer 52 are formed as multi-layer films on the upper surface of the semiconductor layer 42 by, for example, a film forming method using a CVD method.

The conductor layer 52 is a layer having a conductivity and is formed of a material including, for example, tungsten. Each of the conductor layers 52 is used as a word line WL0 to WL7, a select gate line SGS1, a select gate line SGD1, or the like in FIG. 3. The insulator layer 51 is disposed between the conductor layers 52 adjacent to each other and electrically insulates between the conductor layers 52.

A plurality of memory holes MH are formed in the stack 50 to penetrate in the Z-axis direction. A memory pillar 60 is formed inside each memory hole MH. Each memory pillar 60 is formed in a region from the insulator layer 51 located at the uppermost position in the Z-axis direction to the semiconductor layer 42. Each memory pillar 60 corresponds to the NAND string SR shown in FIG. 3.

Figure 5:
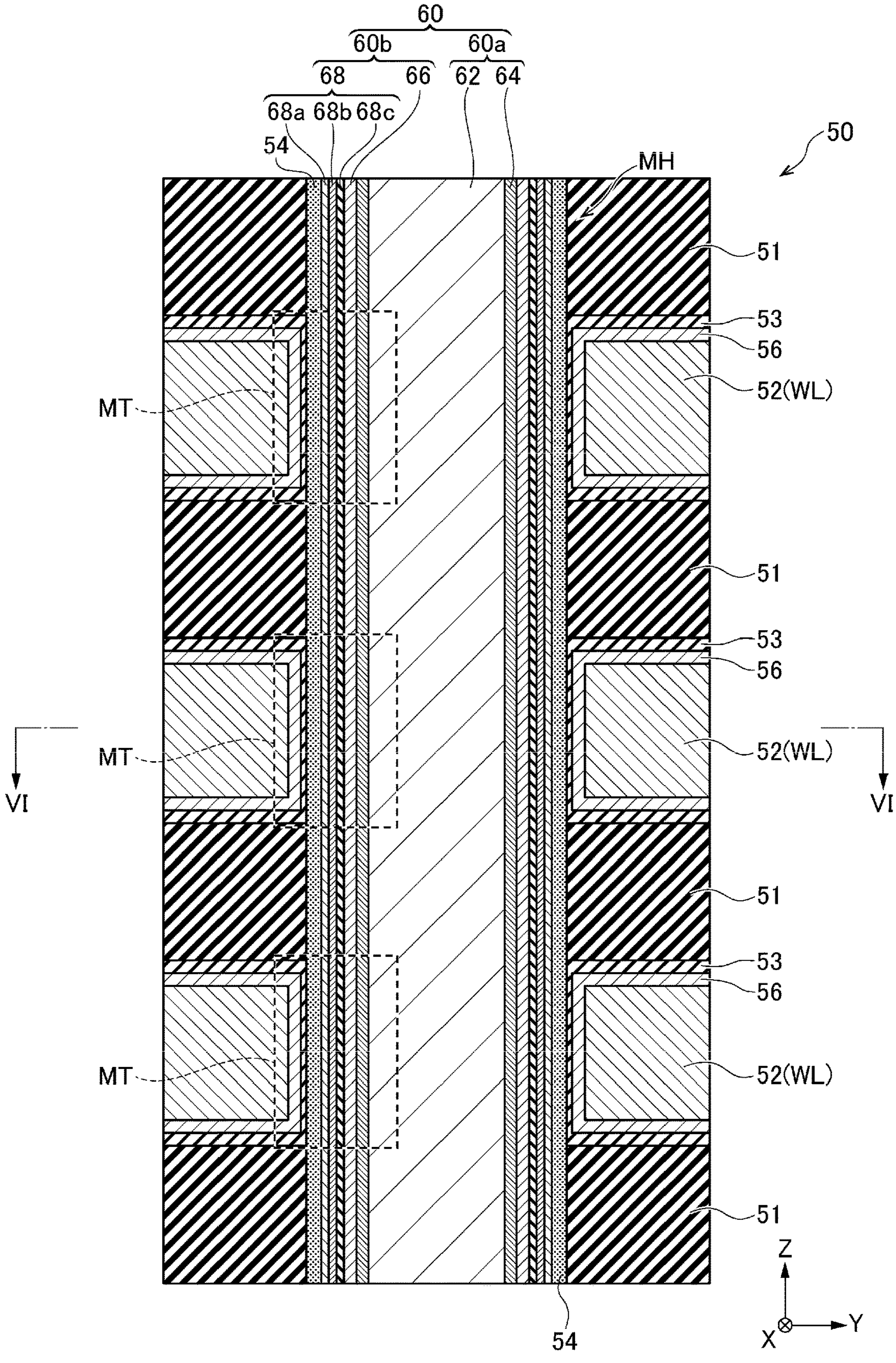
FIG. 5 is a cross-sectional view showing a cross-sectional structure of a memory pillar of the embodiment.
Figure 6:
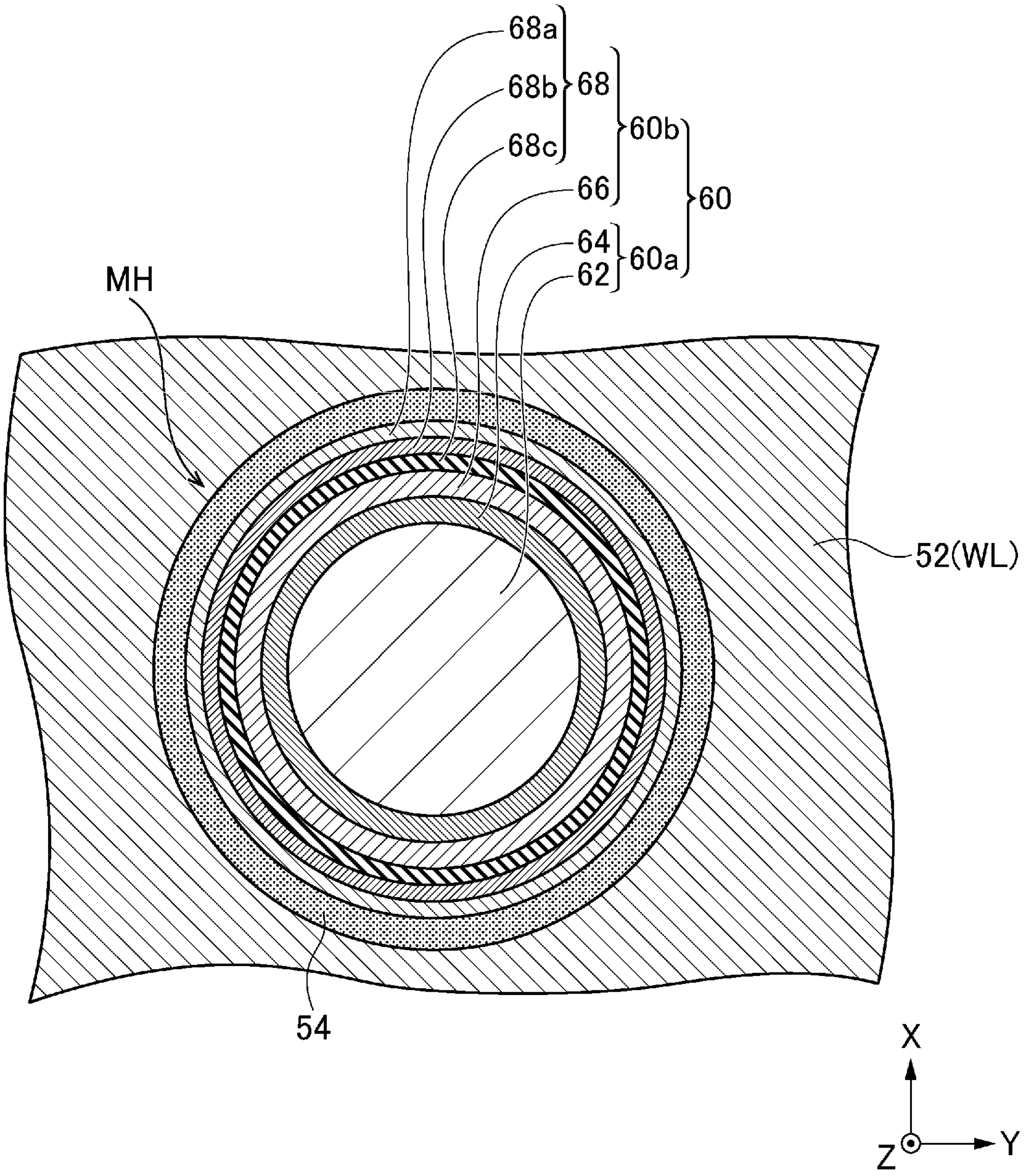
FIG. 6 is a cross-sectional view showing a cross-sectional structure taken along line VI-VI of FIG. 5.

FIG. 5 shows a cross-sectional structure of the stack 50 when the memory pillar 60 is cut along a plane (Y-Z plane) passing through the central axis thereof. FIG. 6 shows a cross-sectional structure taken along the line VI-VI of FIG. 5.

As shown in FIGS. 5 and 6, the memory pillar 60 has a circular or elliptical cross-sectional shape. The memory pillar 60 has a body 60*a* and a stacked film 60*b*.

The body 60*a* has a core portion 62 and a semiconductor portion 64. The semiconductor portion 64 includes a semiconductor material and is formed of, for example, a material including amorphous silicon or a material including polysilicon. The semiconductor portion 64 is a portion that forms a channel of a memory cell transistor MT or the like, and functions as a semiconductor channel of the present embodiment. Therefore, in the present embodiment, the semiconductor portion 64 is also referred to as a channel layer 64. The core portion 62 is provided inside the semiconductor portion 64. The core portion 62 is formed of an insulating material such as silicon oxide, for example. The body 60*a* may have a structure in which the entire body 60*a* is the semiconductor portion 64 and in which the inner core portion 62 is not provided.

The stacked film 60*b* is a multi-layer film formed at a position to cover the outer periphery of the body 60*a*. The stacked film 60*b* has, for example, a tunnel insulating film 66 (in the present embodiment, also referred to as a "tunnel layer") and a charge storage layer 68. The tunnel insulating film 66 is a film provided at the position of the outer periphery of the body 60*a*. The tunnel insulating film 66 includes, for example, a silicon oxide, a silicon oxide and a silicon nitride, or a silicon oxynitride. The tunnel insulating film 66 is a potential barrier between the body 60*a* and the charge storage layer 68. For example, when the electron is injected from the body 60*a* into the charge storage layer 68 (write operation), the electron passes through the potential barrier of the tunnel insulating film 66 (tunneling). In addition, when the positive holes are injected from the body 60*a* to the charge storage layer 68 (erasing operation), the positive holes pass through the potential barrier of the tunnel insulating film 66.

The charge storage layer 68 is a film covering the outside of the tunnel insulating film 66. The charge storage layer 68 contains, for example, silicon nitride. The charge storage layer 68 has trap sites that trap charges in the film. The portion of the charge storage layer 68 interposed between the conductor layer 52 and the body 60*a* configures the charge storage layer storing charges, that is, the portion configures the storage region of the memory cell transistor MT. The threshold voltage of the memory cell transistor MT changes depending on the presence or absence of the charge in the charge storage layer 68 or the amount of the charge. In the present embodiment, the charge storage layer 68 includes a first charge storage layer 68*a*, a dielectric layer 68*b*, and a second charge storage layer 68*c*. The first charge storage layer 68*a*, the dielectric layer 68*b*, and the second charge storage layer 68*c* of the present embodiment will be described in detail later.

As shown in FIG. 5, the outer peripheral surface of the conductor layer 52 is covered with the first block insulating film 53 and the barrier metal film 56. The first block insulating film 53 is a film for reducing the charge back tunneling from the conductor layer 52 to the stacked film 60*b* side. The block insulating film 53 is formed of a material including, for example, a silicon oxide and/or an aluminum oxide. The barrier metal film 56 may be provided using, for example, a titanium nitride film.

A cover insulating film 54 (second block insulating film 54 (in the present embodiment, also referred to as a "block insulating layer")) is provided between the insulator layer 51 and the charge storage layer 68. The cover insulating film 54 may be formed of, for example, a material containing silicon oxide. It is possible that the cover insulating film 54 protects the charge storage layer 68 from being etched in a replacement step of replacing the sacrificial layer (sacrificial layer 55 to be described later) with the conductor layer 52.

A portion of the memory pillar 60 located inside each of the conductor layers 52 functions as a transistor. That is, in each memory pillar 60, a plurality of transistors are electrically connected in series along the longitudinal direction. Each of the conductor layers 52 is connected to the gate of each transistor via the stacked film 60*b*. The semiconductor portion 64 (channel layer 64) inside the transistor functions as a channel of the transistor.

A part of each transistor arranged in series along the longitudinal direction of the memory pillar 60 functions as a plurality of memory cell transistors MT shown in FIG. 3. In addition, the transistors formed at both ends of the plurality of memory cell transistors MT arranged in series function as the select transistors STD and STS shown in FIG. 3, respectively.

As shown in FIG. 4, a plurality of bit lines BL are provided above each of the memory pillars 60. Each bit line BL is formed as a straight wiring extending in the X direction. The bit lines BL are disposed to be arranged in the Y direction. An upper end of the memory pillar 60 is connected to any of the plurality of bit lines BL via a contact Cb. With such a structure, the semiconductor portion 64 of each memory pillar 60 is electrically connected to the bit line BL.

The stack 50 is divided into a plurality of pieces by the slit ST. The slit ST is a linear groove extending along the Y direction in FIG. 4, and is formed at a depth reaching the semiconductor layer 42, for example.

The upper portion of the stack 50 is divided by the slit SHE. The slit SHE is a shallow groove extending in the Y direction. The slit SHE is formed to a depth at which only the conductor layer 52 provided as the select gate line SGD is divided among the plurality of conductor layers 52.

The stacked film 60*b* is removed from the lower end portion of the memory pillar 60. Accordingly, the lower end portion of the semiconductor portion 64 is connected to the semiconductor layer 42. With such a structure, the semiconductor layer 42 functioning as the source line SL and the channel of each transistor are electrically connected.

The semiconductor device 10 according to the present embodiment includes a stack 50, a block insulating layer (second block insulating film) 54, a channel layer (semiconductor portion) 64, a tunnel layer (tunnel insulating film) 66, and a charge storage layer 68. The stack 50 includes a conductor layer 52 and an insulator layer 51 that are alternately stacked. The block insulating layer 54 is provided along the side surface of the stack 50. The charge storage layer 68 is provided between the block insulating layer 54 and the channel layer 64. The tunnel layer 66 is provided between the charge storage layer 68 and the channel layer 64. That is, the block insulating layer 54, the charge storage layer 68, the tunnel layer 66, and the channel layer 64 are provided in this order along a direction from the conductor layer 52 toward the core portion 62. The charge storage layer 68 includes a first charge storage layer 68*a*, a dielectric layer 68*b*, and a second charge storage layer 68*c*. The second charge storage layer 68*c* is provided between the first charge storage layer 68*a* and the tunnel layer 66. The dielectric layer 68*b* is provided between the first charge storage layer 68*a* and the second charge storage layer 68*c*. Therefore, the first charge storage layer 68*a*, the dielectric layer 68*b*, and the second charge storage layer 68*c* are provided in this order.

The first charge storage layer 68*a* contains at least one additive element (hereinafter, also referred to as an additive) of Al, Mo, Nb, Hf, Zr, Ti, B, or P, Si, and N. That is, the first charge storage layer 68*a* contains SiN as a main component and at least one element of Al, Mo, Nb, Hf, Zr, Ti, B, or P as an additive. For example, the concentration of the additive is 5% or less in the first charge storage layer 68*a*. For example, the concentration of the additive is 1% or less in the first charge storage layer 68*a*. The dielectric layer 68*b* contains at least one of silicon oxynitride (SiON), silicon oxycarbonitride (SiOCN), or aluminum oxide (AlOx). AlOx includes, for example, $Al_2O_3$. The second charge storage layer 68*c* contains Si and N, in which Si is contained at a second concentration higher than a first concentration that is a concentration of Si in the first charge storage layer 68*a*. The semiconductor device 10 according to the embodiment of the present disclosure has such a configuration, and thus it is possible to improve write characteristics and charge storage characteristics as described below. Therefore, it is possible to improve the reliability when the semiconductor device 10 is used as a memory, for example.

In the present embodiment, the first charge storage layer 68*a* may contain an oxynitride of at least one of Al, Mo, Nb, Hf, Zr, Ti, B, or P as an additive.

The concentration of the additive contained in the first charge storage layer 68*a* may be, for example, $1\times10^{19}$ atoms/$cm^2$ or more and $5\times10^{20}$ atoms/$cm^2$ or less. By including the additive of $1\times10^{19}$ atoms/$cm^2$ or more, it is possible to effectively implement the deepening of the trap level of the first charge storage layer 68*a* by the additive. In addition, t is preferable that the amount of the additive is $5\times10^{20}$ atoms/$cm^2$ or less since it is possible to reduce the influence of damage due to the additive to the region containing Si and N of the first charge storage layer 68*a*.

The dielectric layer 68*b* may contain AlOx such as $Al_2O_3$, and in this case, the concentration of AlOx is preferably $1\times10^{14}$ atoms/$cm^2$ or more and $1\times10^{15}$ atoms/$cm^2$ or less. By forming the dielectric layer 68*b* containing AlOx, it is possible to increase the dielectric constant, for example, as compared with a case where the dielectric layer 68*b* is formed of SiON or SiOCN. Therefore, it is considered that it is possible to improve the write characteristics, for example, since it is possible to strengthen the tunnel field in the dielectric layer 68*b*.

The second charge storage layer 68*c* preferably has an N/Si ratio of 1.1 or more and 1.2 or less, which is a ratio of N to Si contained. That is, for example, it is preferable that the second charge storage layer 68*c* is formed, when the N/Si ratio is close to stoichiometry and is close to 1.33 in the first charge storage layer 68*a*, the second charge storage layer 68*c* has the second concentration, which is the Si concentration, is higher than the first concentration, which is the Si concentration of the first charge storage layer 68*a*, and the concentration (second concentration) has the N/Si ratio of 1.1 or more and 1.2 or less. The second charge storage layer 68*c* has the N/Si ratio of 1.1 or more and 1.2 or less, and thus it is possible to implement the effect such as reducing the charge leakage caused by the residual of the hole between the regions where the conductor layer 52 is formed during the erasing operation to be described later.

Figure 7:
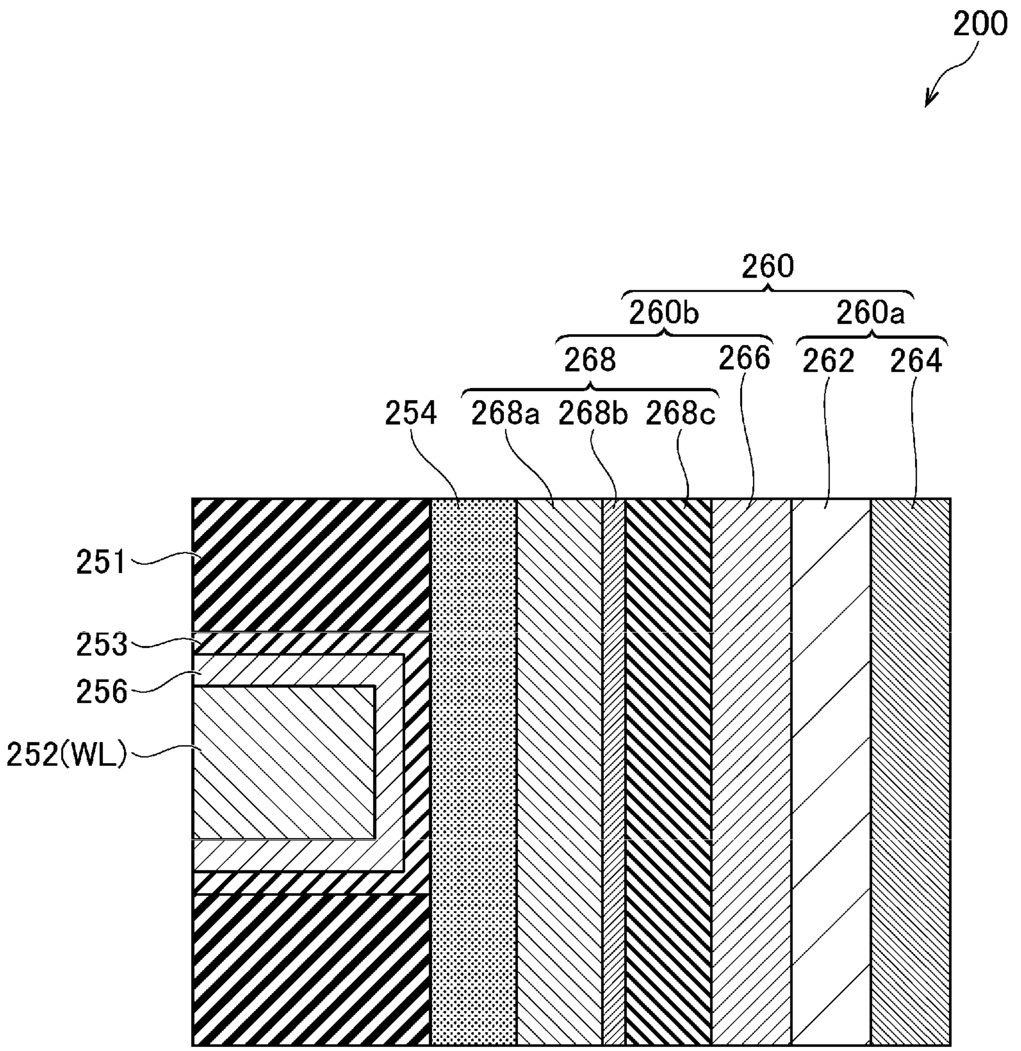
FIG. 7 is a schematic cross-sectional view of a part of a semiconductor device 200 of a comparative example.

Hereinafter, the operation and effect of the semiconductor device 10 according to the embodiment of the present disclosure will be described with reference to the semiconductor device 200 of the comparative example. FIG. 7 is a schematic cross-sectional view of a part of a semiconductor device 200 of a comparative example. As shown in FIG. 7, the semiconductor device 200 of the comparative example includes a block insulating layer (second block insulating film) 254, a channel layer 264, a tunnel layer (tunnel insulating film) 266, a charge storage layer 268, an insulator layer 251 stacked in the Z-axis direction, a conductor layer 252, a first block insulating film 253 covering the conductor layer 252, and a barrier metal film 256. The charge storage layer 268 includes a first charge storage layer 268*a*, a dielectric layer 268*b*, and a second charge storage layer 268*c*. In the comparative example, for example, the charge storage layer 268 is formed of, for example, silicon nitride (SiN), and a dielectric layer 268*b* (NON-configuration) containing, for example, oxygen (O) is provided in the charge storage layer 268 formed of SiN. In the semiconductor device 200, since the dielectric layer 268*b* is provided, it is possible to reduce the leakage of the charge stored in the charge storage layer 268. More specifically, it is considered that the charge stored in the first charge storage layer 268*a* is prevented from passing through the dielectric layer 268*b* in the tunnel layer 266 direction.

On the other hand, the dielectric layer 268*b* is provided, so that the relative volume of the first charge storage layer 268*a* and the second charge storage layer 268*c* may be reduced, and the write characteristics may deteriorate. In addition, since the equivalent oxide thickness (EOT) of the portion in which the dielectric layer 268*b* is provided increases, deterioration of the write characteristics may occur even when the magnitude of the electric field applied to the charge storage layer 268 at the time of writing data is relatively small (that is, when the dielectric layer 268*b* is provided, a larger voltage is applied as compared with a case where the dielectric layer 268*b* is not provided in order to trap the same amount of charge as the charge that can be trapped in a configuration in which the dielectric layer 268*b* is not provided).

On the other hand, according to the semiconductor device 10 according to the embodiment of the present disclosure, the first charge storage layer 68*a* in the charge storage layer 68 having the NON-configuration contains at least one additive of Si, N, and at least one of Al, Mo, Nb, Hf, Zr, Ti, B, or P, and thus it is possible to improve deterioration of write characteristics described above and the like of the semiconductor device 200 according to the comparative example. In addition, in the present embodiment, by adding at least one of Al, Mo, Nb, Hf, Zr, Ti, B, or P to the first charge storage layer 68*a* on the block insulating layer 54 side, the trap level in the first charge storage layer 68*a* can be deepened. Therefore, the charge is easily trapped, and thus it is possible to reduce the leakage of the charge. Therefore, it is possible to improve the write characteristics and the charge storage characteristics.

Further, in the semiconductor device 10 according to the embodiment of the present disclosure, the second charge storage layer 68*c* is provided in such that the second charge storage layer 68*c* has the concentration of the Si contained in the second charge storage layer 68*c* provided on the tunnel layer 66 side of the charge storage layer 68 entering the second concentration higher than the first concentration which is the concentration of the Si in the first charge storage layer 68*a* is contained. That is, since the second charge storage layer 68*c* contains a relatively large amount of Si, it is considered that the erasure of the stored charge (that is, the leakage of charge) is promoted, for example, at the time of erasing data. Therefore, it is considered that since the number of holes required when the data is erased can be reduced, the number of holes remaining in the region between the conductor layers 52 can be reduced as compared with that of the semiconductor device 200 according to the comparative example. Therefore, it is considered that it is possible to reduce the leakage of the charge caused by the remaining hole.

In the semiconductor device 10 according to the embodiment of the present disclosure, the concentration of Si is relatively high in the second charge storage layer 68*c* on the tunnel layer 66 side. Therefore, it is possible to reduce the charge leakage that is likely to occur when the concentration of Si in the charge storage layer 268 is simply increased, and thus the erase characteristics can be improved. In addition, it is possible to reduce the residual of the hole between the conductor layers 52 at the time of erasing, and the like, and thus it is possible to reduce the leakage of the charges in the Z-axis direction.

As described above, the semiconductor device 10 according to the embodiment of the present disclosure has the above-described configuration, and thus it is possible to improve write characteristics and the like. Therefore, it is possible to improve the reliability.

Figure 8:
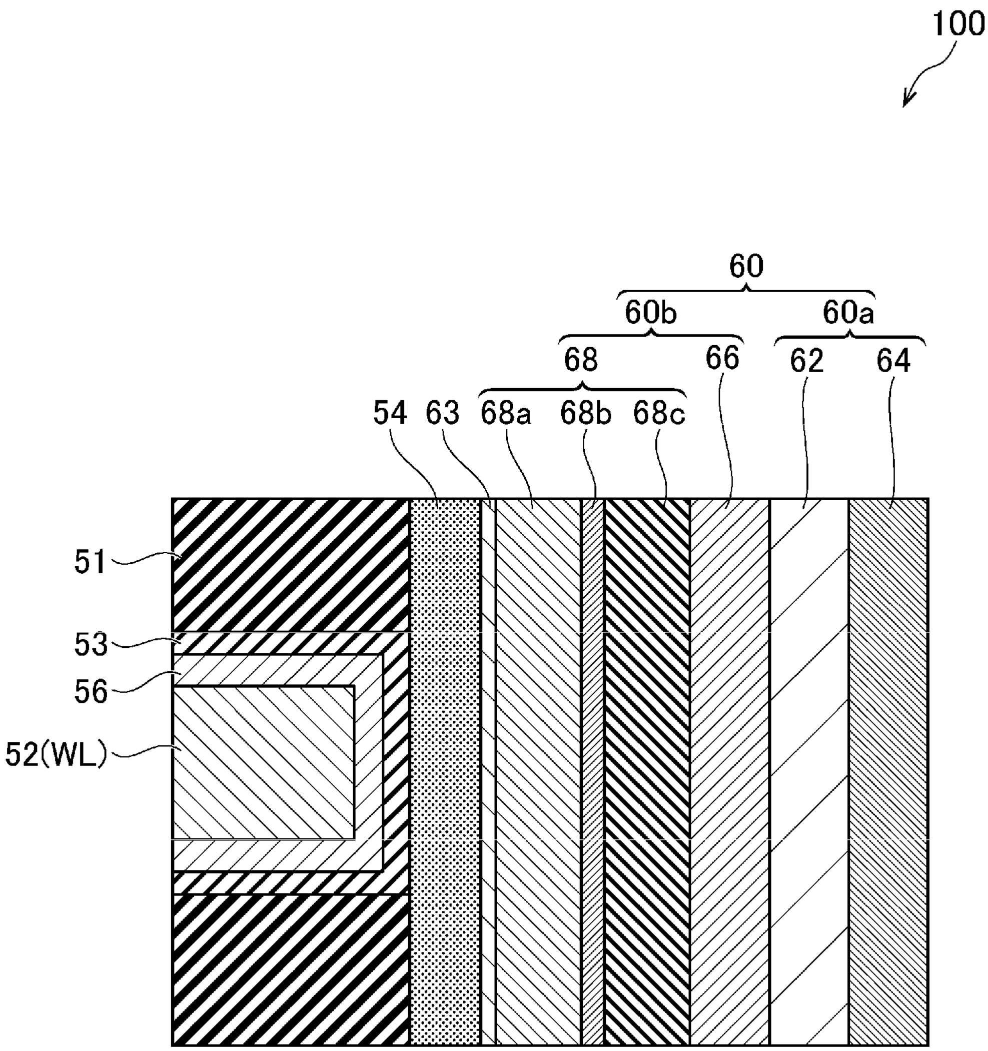
FIG. 8 is a schematic cross-sectional view of a part of the semiconductor device 10 of a modification example.

Hereinafter, a first modification example of the present embodiment will be described. FIG. 8 is a schematic cross-sectional view of a part of the semiconductor device 10 of the first modification example. As shown in FIG. 8, the semiconductor device 10 may have an interface dipole layer 63 containing AlOx such as aluminum oxide ($Al_2O_3$) formed at the interface between the block insulating layer 54 and the first charge storage layer 68*a*, for example. By forming the interface dipole layer 63, the capture of charges can be promoted in the vicinity of the interface dipole layer 63. For example, when the block insulating layer 54 contains silicon oxide ($SiO_2$), and the interface dipole layer 63 containing $Al_2O_3$ is provided, in the relationship of the oxygen surface density, since a surface density of $Al_2O_3$ is larger than a surface density of $SiO_2$, in the vicinity of the interface between the interface dipole layer 63 and the block insulating film 53, a dipole is formed, in which the block insulating film 54 side is negative and the interface dipole layer 63 side is positive. Therefore, the charge injected to the charge storage layer 68 such as the charge injected from the channel layer 64 side is easily captured in the vicinity of the interface between the interface dipole layer 63 and the block insulating layer 54 on the interface dipole layer 63 side. Therefore, the write characteristics can be improved. The concentration of AlOx at the interface between the block insulating layer 54 and the first charge storage layer 68*a* at the time of forming the interface dipole layer 63 containing AlOx is, for example, preferably $1\times10^{14}$ atoms/$cm^2$ or more and $1\times10^{15}$ atoms/$cm^2$ or less from the viewpoint of improving the write characteristics and the like due to the formation of the dipole.

Figure 9:
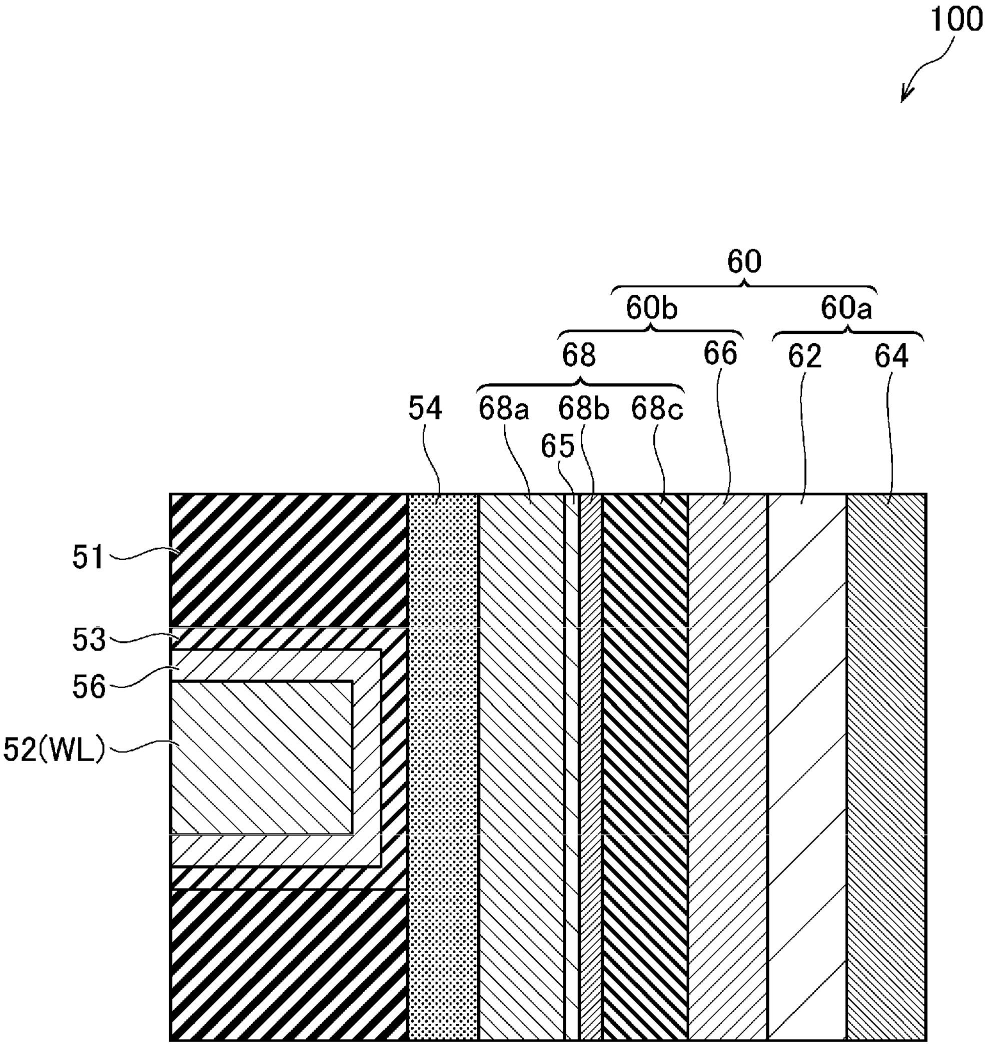
FIG. 9 is a schematic cross-sectional view of a part of a modification example of the semiconductor device 10.

Hereinafter, a second modification example of the present embodiment will be described. FIG. 9 is a schematic cross-sectional view of a part of a semiconductor device 10 of a second modification example. As shown in FIG. 9, an anti-oxidation layer 65 containing SiCN or SiOCN may be provided between the first charge storage layer 68*a* and the dielectric layer 68*b*. The materials of the dielectric layer 68*b* and the anti-oxidation layer 65 are different from each other. The oxidation of the first charge storage layer 68*a* can be reduced by providing the anti-oxidation layer 65. In addition, since the layer containing carbon (C) such as the anti-oxidation layer 65 of the present embodiment is provided, it is possible to improve the effect of trapping charges, and thus it is possible to reduce the deterioration of the write characteristics and/or the erase characteristics. The anti-oxidation layer 65 may be formed of, for example, SiCN or may be formed of SiOCN. Alternatively, for example, after the first charge storage layer 68*a* is formed, a layer may be formed using SiCN outside the chamber in which the first charge storage layer 68*a* is formed and oxidized to form the SiOCN layer and the anti-oxidation layer 65.

In addition, the anti-oxidation layer 65 may have the concentration of C in the SiCN or SiOCN contained in the anti-oxidation layer 65 higher on the block insulating layer 54 side than on the tunnel layer 66 side of the anti-oxidation layer 65. When the anti-oxidation layer 65 has the concentration of C higher on the block insulating layer 54 side, since the concentration of C at the interface of the anti-oxidation layer 65 with the first charge storage layer 68*a* is high, it is considered that the charge storage effect in the first charge storage layer 68*a* can be improved. Therefore, it is considered that it is possible to further reduce the deterioration of the above-described write characteristics and/or erase characteristics.

In addition, in the present embodiment, the first charge storage layer 68*a* contains at least one of Al, Mo, Nb, Hf, Zr, Ti, B, or P as described above, but the first charge storage layer 68*a* may contain an oxynitride of at least one of Al, Mo, Nb, Hf, Zr, Ti, B, or P.

In the present embodiment, each of the above-described configurations and modification examples may be used in combination. For example, as described above, when the interface dipole layer 63 containing AlOx is provided between the block insulating layer 54 and the first charge storage layer 68*a*, the anti-oxidation layer 65 containing SiCN or SiOCN may be provided between the first charge storage layer 68*a* and the dielectric layer 68*b*, and in this case, the dielectric layer 68*b* may contain AlOx. It is considered that, by combining these configurations, for example, the above-described write characteristics and/or erase characteristics can be further improved.

Method for Manufacturing Semiconductor Device

Next, a manufacturing method of the semiconductor device 10 according to the present embodiment will be described with reference to FIGS. 10 to 19. FIGS. 10 to 19 are cross-sectional views schematically showing a part of the manufacturing step of the semiconductor device 10 according to the present embodiment.

Figure 10:
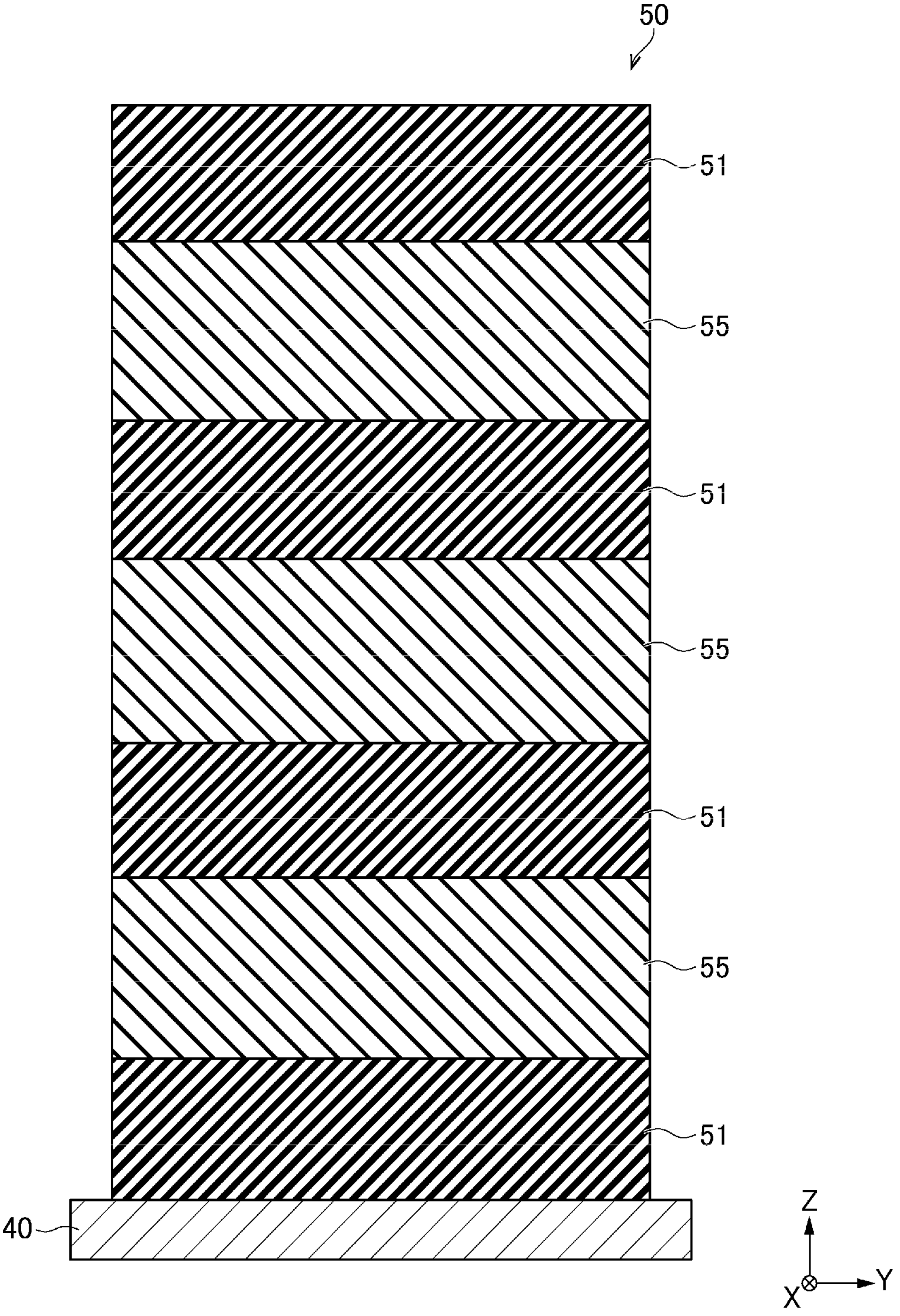
FIG. 10 is a cross-sectional view showing a part of the manufacturing step of the semiconductor device of the embodiment.

As shown in FIG. 10, first, a stack 50 including a plurality of insulator layers 51 and a plurality of sacrificial layers 55 alternately is formed on a substrate 40. The substrate 40 is a plate-like member having a flat surface on the Z-axis direction side, and is, for example, a semiconductor substrate such as a silicon substrate. Although not shown in FIG. 10, an insulator layer 41 and a semiconductor layer 42 (refer to FIG. 4) may be formed on the substrate 40, and the insulator layer 41 may be formed of an insulating material such as silicon oxide, for example. In addition, the semiconductor layer 42 may be formed of a material including silicon, such as polycrystalline silicon doped with an impurity, for example. The insulator layer 51 configuring the stack 50 is formed of, for example, a material containing silicon oxide. The insulator layer 51 may be, for example, a TEOS layer. The TEOS layer is a silicon oxide layer formed of tetra ethyl ortho silicate (TEOS) as a raw material and may be formed using, for example, a CVD method. The sacrificial layer 55 is replaced with the conductor layer 52 in a subsequent replacement step. The sacrificial layer 55 may be formed by, for example, a CVD method using a material containing silicon nitride. When the sacrificial layer 55 is substituted with the conductor layer 52 in the subsequent step, the insulator layer 51 is disposed between the conductor layers 52 adjacent to each other to electrically insulate between the conductor layers 52. In FIG. 10, the case where in the insulator layers 51 and the sacrificial layers 55, four layers and three layers are stacked respectively, is schematically shown, but the number of stacked layers of the stack 50 is not limited thereto. For example, three or less layers or five or more layers of the insulator layer 51 and the sacrificial layer 55 (the conductor layer 52 functioning as a word line formed after removing the sacrificial layer 55 to be described later) may be stacked, and for example, 100 or more layers may be stacked.

Figure 11:
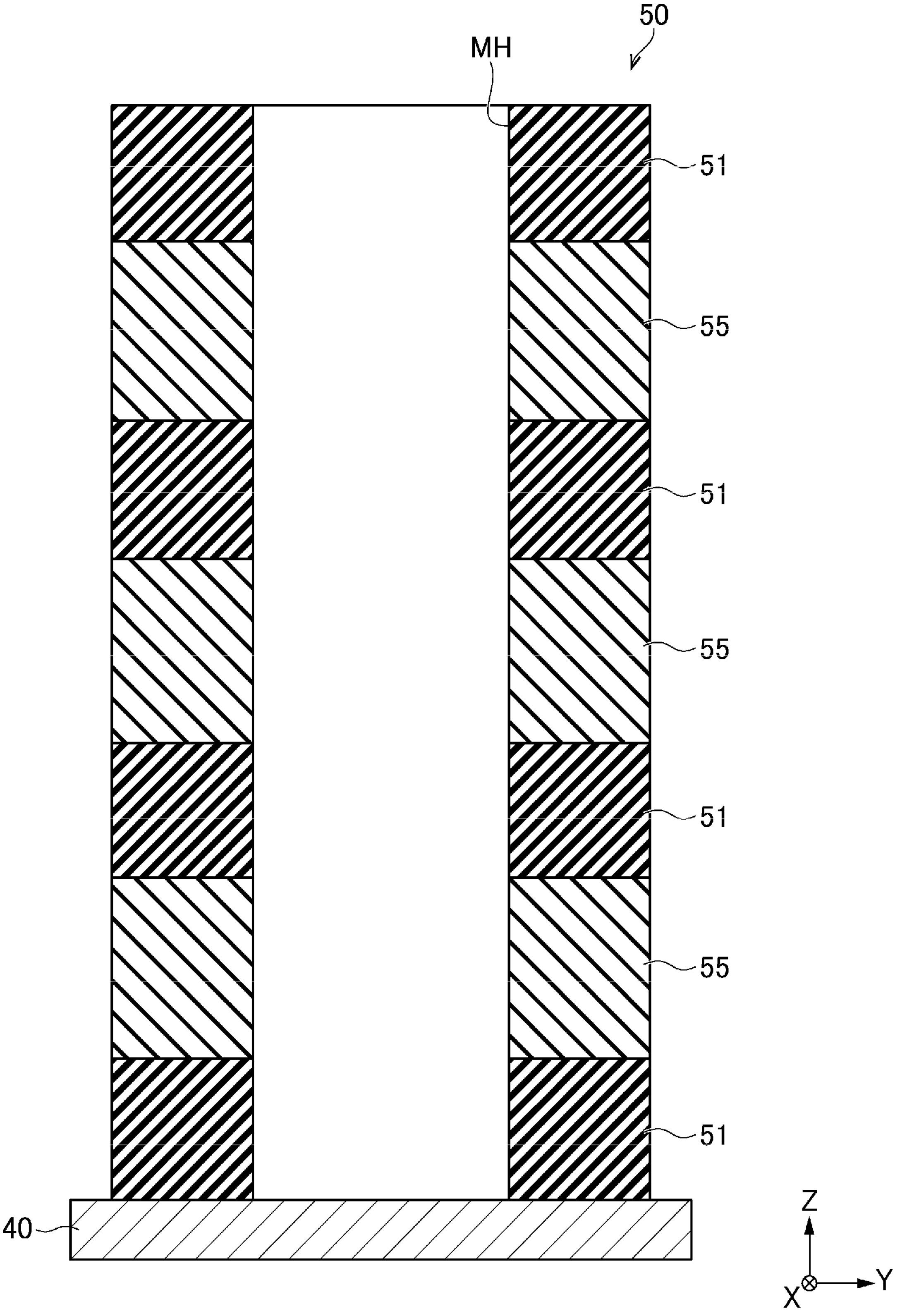
FIG. 11 is a cross-sectional view showing a part of the manufacturing step of the semiconductor device of the embodiment.

Next, as shown in FIG. 11, a memory hole MH is formed in the stack 50 to penetrate the stack 50. The memory hole MH may be formed by, for example, anisotropic etching by reactive ion etching (RIE).

Figure 12:
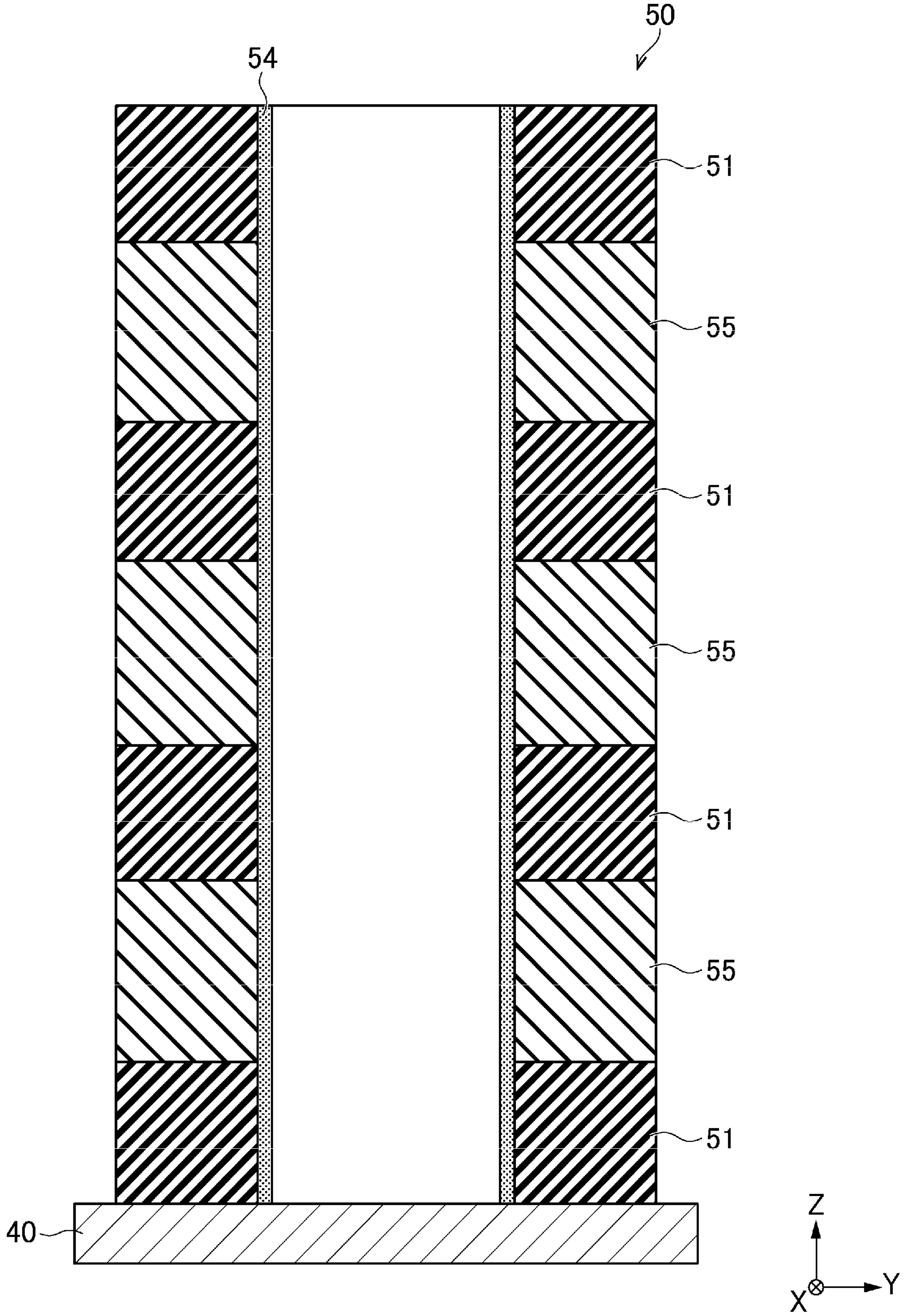
FIG. 12 is a cross-sectional view showing a part of the manufacturing step of the semiconductor device of the embodiment.

Subsequently, as shown in FIG. 12, a cover insulating film 54 (second block insulating film 54, in the present embodiment, also referred to as the block insulating layer 54) is formed on each of the inner surfaces of the insulator layer 51 and the conductor layer 52 in the memory hole MH. The cover insulating film 54 may be formed of, for example, a material containing silicon oxide.

Figure 13:
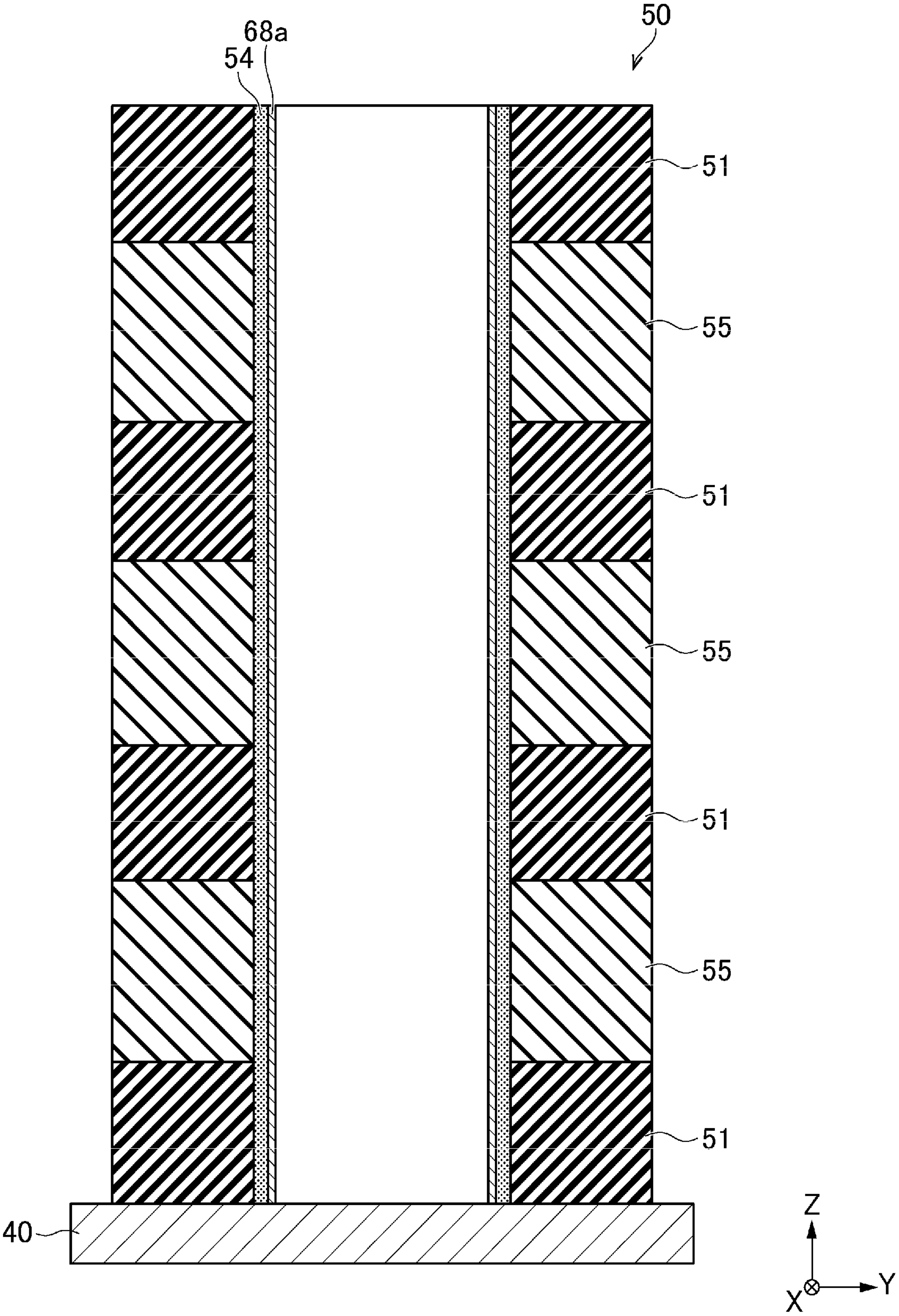
FIG. 13 is a cross-sectional view showing a part of the manufacturing step of the semiconductor device of the embodiment.

Next, the charge storage layer 68 is formed on the inner surface side of the cover insulating film 54. As shown in FIG. 13, first, the first charge storage layer 68*a* is formed. The first charge storage layer 68*a* contains at least one additive element of Si, N and at least one of Al, Mo, Nb, Hf, Zr, Ti, B, or P. The first charge storage layer 68*a* may be formed by supplying a gas containing an additive (at least one of Al, Mo, Nb, Hf, Zr, Ti, B, or P described above) during the film formation of silicon nitride (SiN), for example. For example, a SiN film may be formed by using $SiH_2Cl_2$ gas and $NH_3$ gas as a precursor in a reduced pressure environment (2000 Pa or less) of 300° C. or higher and 800° C. or lower by atomic layer deposition (ALD), and the first charge storage layer 68*a* may be formed by supplying a gas of an additive during the sequence of the ALD. In addition, the first charge storage layer 68*a* may be formed by first supplying a gas of Si, nitriding the Si, and then supplying the gas containing the additive.

For example, when Al is added as an additive, a gas containing $AlCl_3$ may be used as the gas containing an additive, or a gas containing trimethylaluminium (TMA, $CH_3Al$) may be used. In addition, for example, when Mo is added as an additive, a MoNx gas may be used, and MoNx may be formed of, for example, $MoCl_5$, $NH_3$, and Zn. For example, when Nb is added as an additive, a gas of NbOxNy may be used, and NbOxNy may be formed by, for example, $NbCl_5+H_2O+NH_3$. For example, when Nb is added as an additive, tetrakis(ethylmethylamino) hafnium (TEMAH, $[(CH_3)(C_2H_5)N]_4Hf$) may be used. In addition, for example, when Zr is added as an additive, a gas of zirconium acetate (Zac (Zirconium Acetate), $C_8H_{12}O_8Zr$) may be used. In addition, for example, when Ti is added as an additive, a gas of tetrakis(dimethylamino) titanium (TDMAT, $Ti[N(CH_3)]_2]_4$) may be used. In addition, for example, when B is added as an additive, boron trichloride ($BCl_3$) gas may be used. In addition, for example, when P is added as an additive, a gas of hydrogen phosphide ($PH_3$) may be used.

Figure 14:
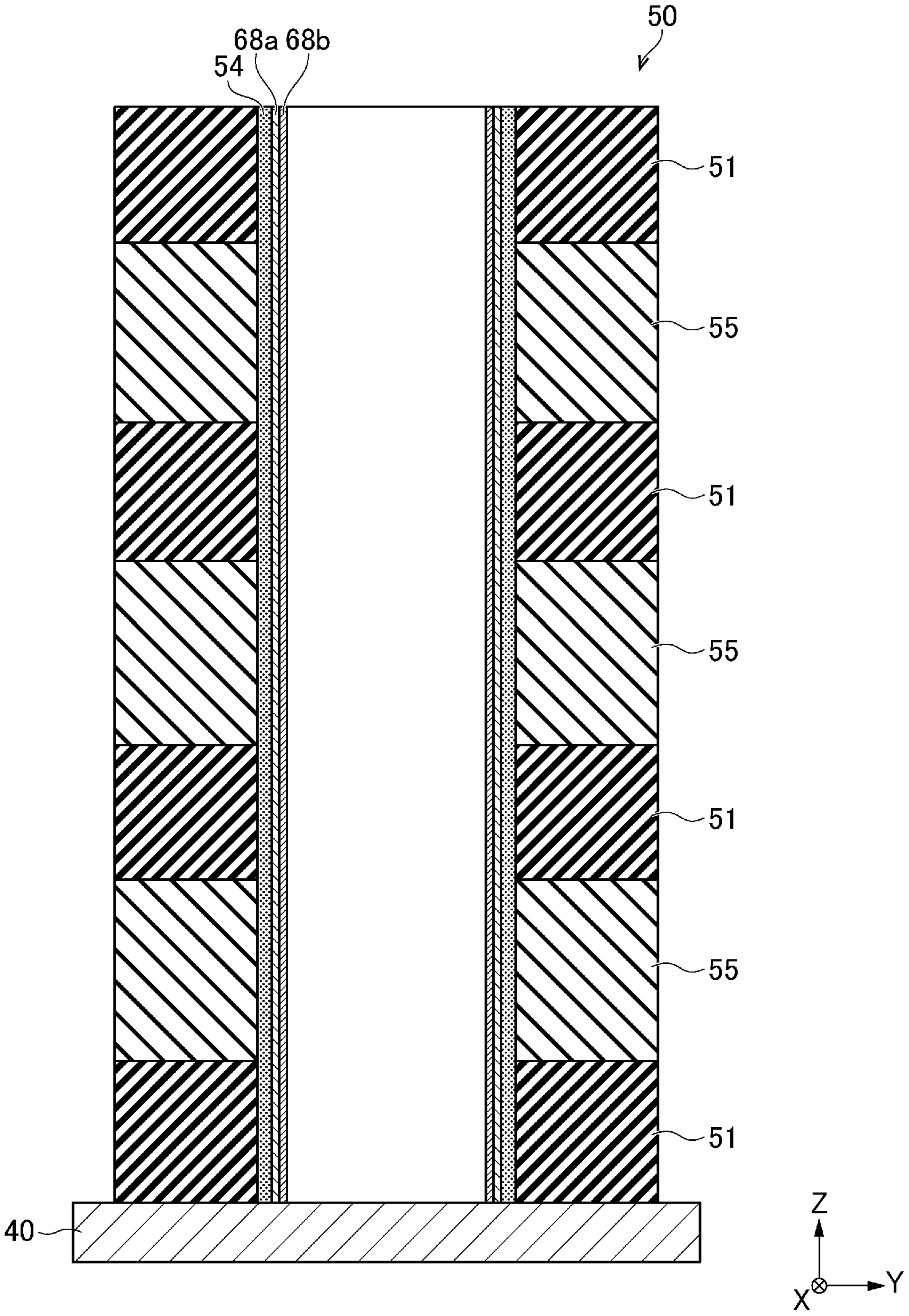
FIG. 14 is a cross-sectional view showing a part of the manufacturing step of the semiconductor device of the embodiment.

Next, as shown in FIG. 14, the dielectric layer 68*b* is formed on the inner surface side of the first charge storage layer 68*a*. The dielectric layer 68*b* contains, for example, SiON, SiOCN, or AlOx. For example, when forming the dielectric layer 68*b* containing SiON, the dielectric layer 68*b* may be formed by forming the first charge storage layer 68*a*, then moving the semiconductor device including the substrate 40 and the stack 50 in the manufacturing step from the chamber used for forming the first charge storage layer 68*a* to the outside of the chamber, exposing the semiconductor device in the atmosphere and naturally oxidizing the semiconductor device. Alternatively, through a process of thermal oxidizing, radical oxidizing, and/or depositing using CVD, ALD, or the like, the surface of the first charge storage layer 68*a* may be oxidized to a predetermined thickness (for example, 1 nm), so that the dielectric layer 68*b* may be formed.

Figure 15:
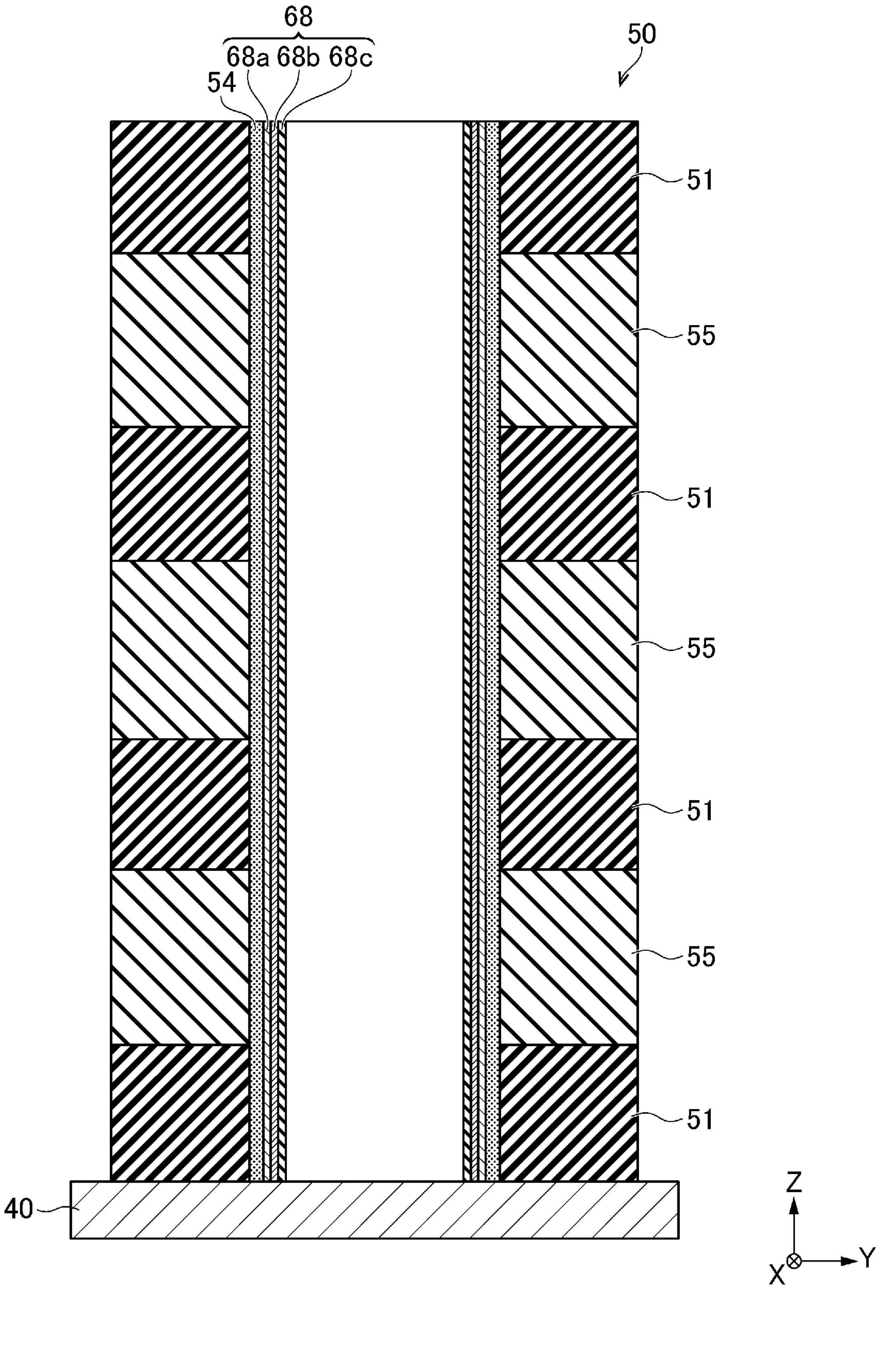
FIG. 15 is a cross-sectional view showing a part of the manufacturing step of the semiconductor device of the embodiment.

Next, as shown in FIG. 15, the second charge storage layer 68*c* is formed on the inner surface side of the dielectric layer 68*b*. In the second charge storage layer 68*c*, when the Si concentration of the first charge storage layer 68*a* is defined as the first concentration and the Si concentration of the second charge storage layer 68*c* is defined as the second concentration, the first concentration is less than the second concentration. The second charge storage layer 68*c* may be formed by, for example, the ALD method and by using a $SiH_2Cl_2$ gas and an $NH_3$ gas, as in the first charge storage layer 68*a* described above. At this time, for example, the Si concentration of the second charge storage layer 68*c* can be adjusted by adjusting the time for which the $SiH_2Cl_2$ gas and the $NH_3$ gas flow. For example, the Si concentration can be made relatively high by making the time for supplying the $SiH_2Cl_2$ gas relatively long and making the time for supplying the $NH_3$ gas relatively short. As described above, the second charge storage layer 68*c* contains Si and N such that in the second charge storage layer 68*c*, the N/Si ratio which is the ratio of N and Si is smaller than the N/Si ratio of the first charge storage layer 68*a* and is set to 1.1 or more and 1.2 or less.

As described above, the charge storage layer 68 is formed by forming the first charge storage layer 68*a*, the dielectric layer 68*b*, and the second charge storage layer 68*c*.

Figure 16:
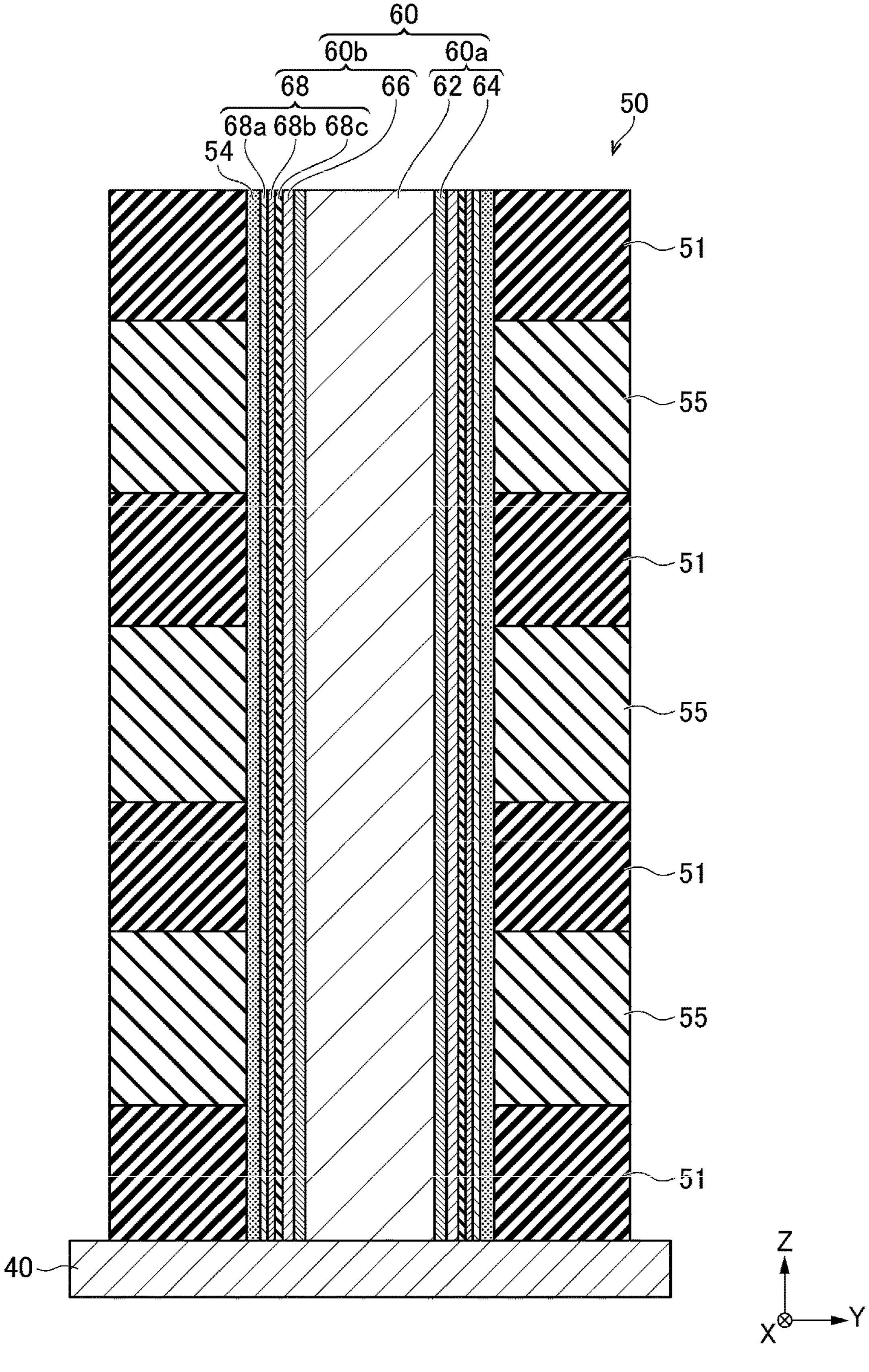
FIG. 16 is a cross-sectional view showing a part of the manufacturing step of the semiconductor device of the embodiment.

Subsequently, as shown in FIG. 16, the tunnel insulating film 66 is formed on the inner surface side of the second charge storage layer 68*c* to form the stacked film 60*b* including the charge storage layer 68 and the tunnel insulating film 66, and the channel layer 64 and the core portion 62 are formed on the inner surface side of the tunnel insulating film 66 to form the body 60*a*. The tunnel layer 66 may be formed of, for example, a material containing silicon oxide or a material containing silicon oxide and silicon nitride. The channel layer 64 may be formed of, for example, a material including a semiconductor material and may be formed of, for example, a material including amorphous silicon. The core portion 62 may be formed of an insulating material such as silicon oxide, for example.

Figure 17:
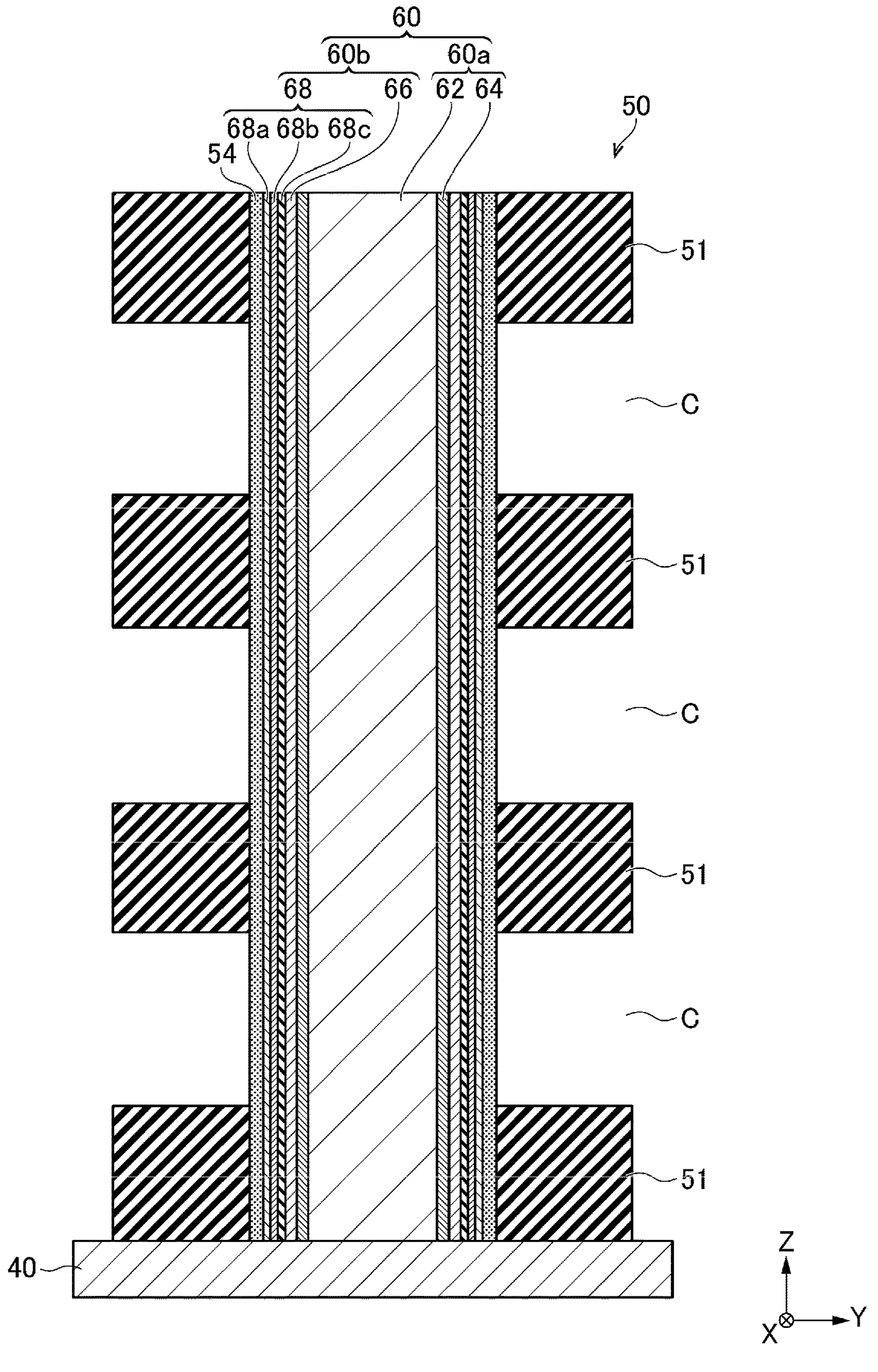
FIG. 17 is a cross-sectional view showing a part of the manufacturing step of the semiconductor device of the embodiment.

Next, after forming a groove (not shown) in the stack 50, the sacrificial layer 55 is removed using the groove. The groove may be formed in the depth direction (Z-axis direction) to reach the substrate 40 by, for example, RIE. The sacrificial layer 55 may be removed by wet etching through a groove using a chemical solution such as phosphoric acid. As a result, as shown in FIG. 17, a void C is formed between the adjacent insulator layers 51. As shown in FIG. 17, the surfaces of the insulator layer 51 in the Z-axis direction and the second block insulating film 54 (surface in the Y-axis direction) are exposed in the void C. The second block insulating film 54 is provided, so that the charge storage layer 68 is protected from being etched in the step of removing the sacrificial layer 55.

Figure 18:
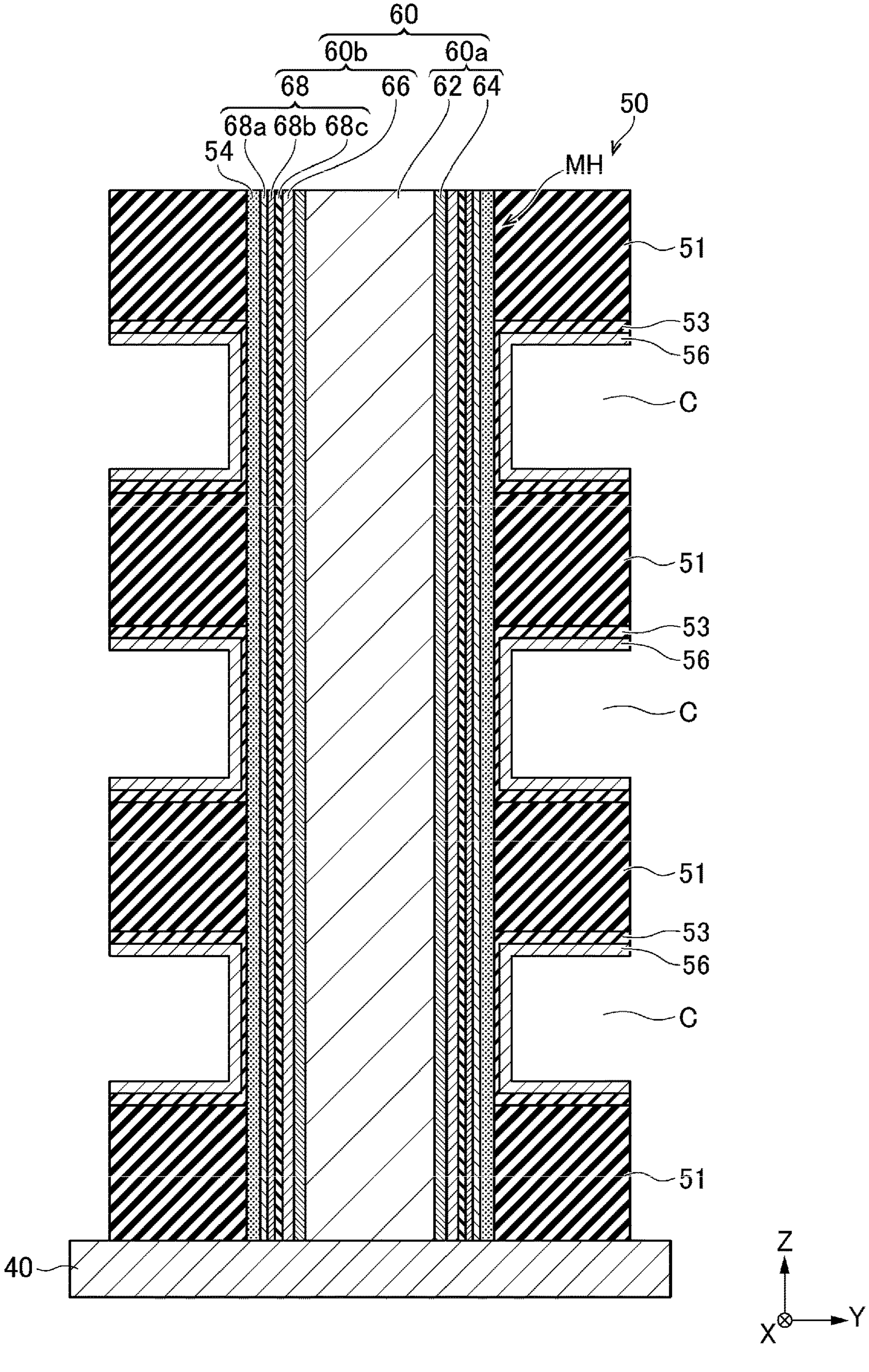
FIG. 18 is a cross-sectional view showing a part of the manufacturing step of the semiconductor device of the embodiment.

Next, the first block insulating film 53 and the barrier metal film 56 are formed in this order on the surface of the insulator layer 51 in the Z-axis direction and the surface of the second block insulating film 54 in the Y direction. As a result, as shown in FIG. 18, the first block insulating film 53 and the barrier metal film 56 are formed in the void C. The first block insulating film 53 includes, for example, an aluminum oxide film, and the aluminum oxide film may be formed using, for example, a thermal CVD method or an ALD method. The barrier metal film 56 is formed. The barrier metal film 56 may be formed by, for example, a CVD method or an ALD method using a material containing titanium nitride (TiN).

Figure 19:
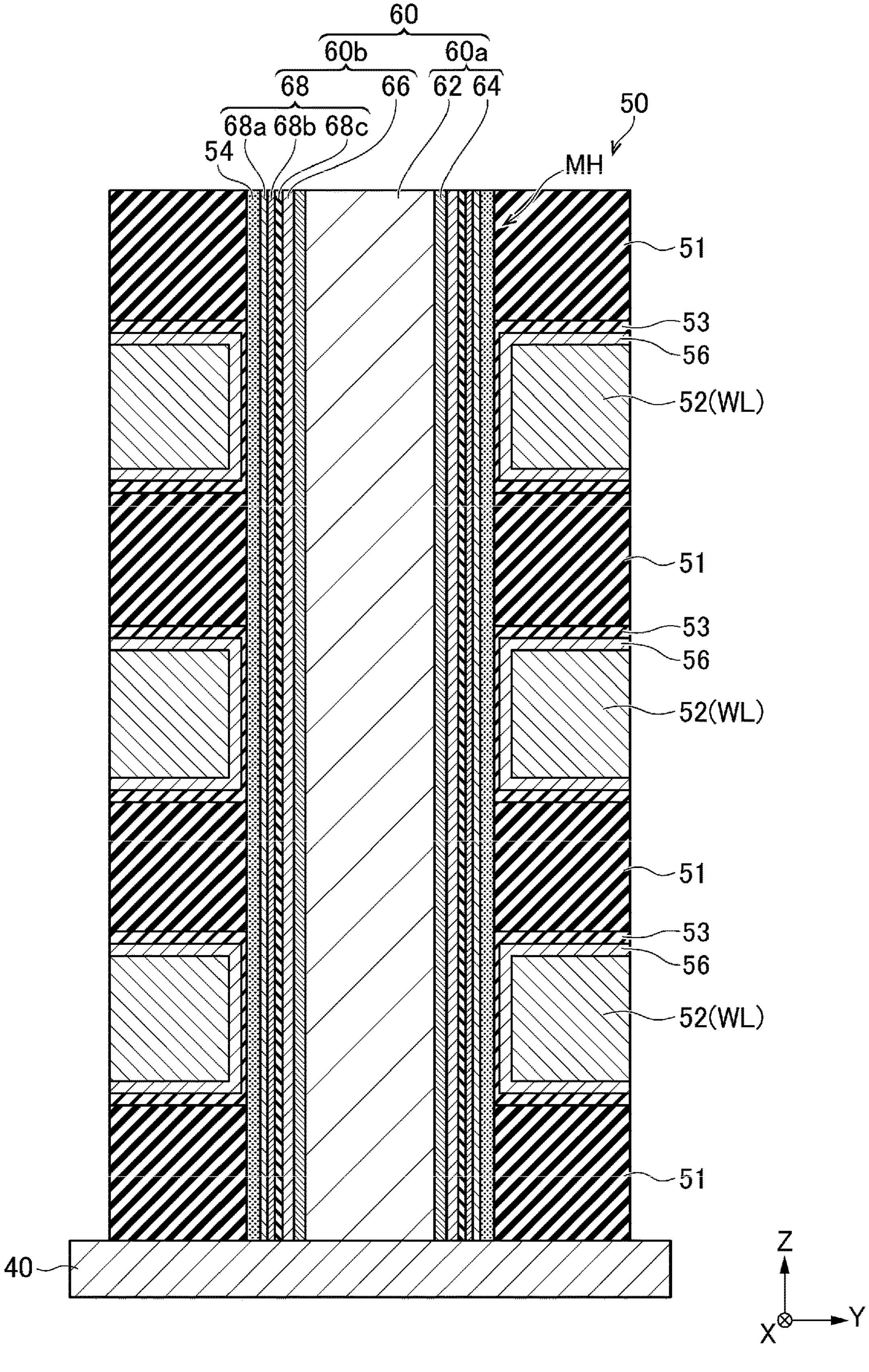
FIG. 19 is a cross-sectional view showing a part of the manufacturing step of the semiconductor device of the embodiment.

Subsequently, as shown in FIG. 19, the conductor layer 52 is formed on the surface of the barrier metal film 56 (the surface in the Z-axis direction and the surface in the Y direction). The conductor layer 52 may be provided by forming, for example, a tungsten film. The tungsten film may be formed by a CVD method, for example, and by using a processing gas containing tungsten hexafluoride ($WF_6$) gas as a film-forming gas and hydrogen ($H_2$) gas as a reducing gas. As described above, the conductor layer 52 including the tungsten film formed in this manner functions as a word line.

As described above, the semiconductor device 10 of the present embodiment is formed.

Appendix 1

A semiconductor device including:

a stack including a conductor layer and an insulator layer alternately stacked;

a block insulating layer provided along a side surface of the stack;

a channel layer;

a charge storage layer provided between the block insulating layer and the channel layer; and a tunnel layer provided between the charge storage layer and the channel layer, in which the charge storage layer includes a first charge storage layer containing Si, N and at least one of Al, Mo, Nb, Hf, Zr, Ti, B, or P, a second charge storage layer containing Si and N, in which Si is contained at a second concentration higher than a first concentration that is a concentration of Si in the first charge storage layer, and provided between the first charge storage layer and the tunnel layer, and a dielectric layer containing 0 and provided between the first charge storage layer and the second charge storage layer.

Appendix 2

The semiconductor device according to appendix 1, in which the dielectric layer contains at least one of silicon oxynitride (SiON), silicon oxycarbonitride (SiOCN), or aluminum oxide (AlOx).

Appendix 3

The semiconductor device according to appendix 1, further including:

an interface dipole layer provided between the block insulating layer and the first charge storage layer and containing AlOx.

Appendix 4

The semiconductor device according to appendix 3, in which a concentration of AlOx in the interface dipole layer is equal to or more than $1\times10^{14}$ atoms/cm$^2$ and equal to or less than $1\times10^{15}$ atoms/cm$^2$.

Appendix 5

The semiconductor device according to appendix 1, further including:

an anti-oxidation layer provided between the first charge storage layer and the dielectric layer and containing SiCN or SiOCN.

Appendix 6

The semiconductor device according to appendix 5, in which the anti-oxidation layer has a concentration of C in SiCN or SiOCN contained in the anti-oxidation layer, which is higher on a block insulating layer side than on a tunnel layer side of the anti-oxidation layer.

Appendix 7

The semiconductor device according to appendix 1, in which the first charge storage layer contains at least one oxynitride of Al, Mo, Nb, Hf, Zr, Ti, B, or P.

Appendix 8

The semiconductor device according to appendix 1, in which the first charge storage layer contains at least one of Al, Mo, Nb, Hf, Zr, Ti, B, or P at a concentration equal to or more than $1\times10^{19}$ atoms/cm$^2$ and equal to or less than $5\times10^{20}$ atoms/cm$^2$.

Appendix 9

The semiconductor device according to appendix 2, in which the dielectric layer contains AlOx having a concentration equal to or more than $1\times10^{14}$ atoms/cm$^2$ and equal to or less than $1\times10^{15}$ atoms/cm$^2$.

Appendix 10

The semiconductor device according to appendix 3, further including:

an anti-oxidation layer provided between the first charge storage layer and the dielectric layer and containing SiCN or SiOCN, in which the dielectric layer contains AlOx.

Appendix 11

The semiconductor device according to appendix 1, in which the second charge storage layer has an N/Si ratio equal to or more than 1.1 and equal to or less than 1.2.

Appendix 12

A semiconductor device including:

a stack including a conductor layer and an insulator layer alternately stacked;

a block insulating layer provided along a side surface of the stack;

a channel layer;

a charge storage layer provided between the block insulating layer and the channel layer; and a tunnel layer provided between the charge storage layer and the channel layer, in which the charge storage layer includes a first charge storage layer containing at least one of Al, Mo, Nb, Hf, Zr, Ti, B, or P, Si and N at a concentration equal to or more than $1\times10^{19}$ atoms/cm$^2$ and equal to or less than $5\times10^{20}$ atoms/cm$^2$, a second charge storage layer containing Si and N to have an N/Si ratio that is smaller than an N/Si ratio of the first charge storage layer and that is equal to or more than 1.1 and equal to or less than 1.2, and provided between the first charge storage layer and the tunnel layer, and a dielectric layer containing 0 and provided between the first charge storage layer and the second charge storage layer.

Appendix 13

A manufacturing method of a semiconductor device, the method including:

forming a block insulating layer;

forming a first charge storage layer containing Si, N, and at least one of Al, Mo, Nb, Hf, Zr, Ti, B, or P, along a direction in which the block insulating layer extends;

forming a dielectric layer containing O, along the first charge storage layer; and forming a second charge storage layer containing Si and N, in which Si is contained at a second concentration higher than a first concentration that is a concentration of Si in the first charge storage layer, along the dielectric layer.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:

a stack including a conductor layer and an insulator layer alternately stacked;

a block insulating layer disposed along a side surface of the stack;

a channel layer;

a charge storage layer disposed between the block insulating layer and the channel layer; and a tunnel layer disposed between the charge storage layer and the channel layer, wherein the charge storage layer includes:

a first charge storage layer containing Si, N and at least one of Al, Mo, Nb, Hf, Zr, Ti, B, or P, the Si in the first charge storage layer having a first Si concentration, a second charge storage layer containing Si and N, the Si in the second charge storage layer having a second Si concentration higher than the first Si concentration, the second charge storage layer disposed between the first charge storage layer and the tunnel layer, and a dielectric layer containing O, the dielectric layer disposed between the first charge storage layer and the second charge storage layer.

2. The semiconductor device according to claim 1, wherein the dielectric layer contains at least one of silicon oxynitride (SiON), silicon oxycarbonitride (SiOCN), or aluminum oxide (AlOx).

3. The semiconductor device according to claim 1, further comprising:

an interface layer disposed between the block insulating layer and the first charge storage layer, the interface layer containing AlOx.

4. The semiconductor device according to claim 3, wherein a concentration of AlOx in the interface layer is equal to or more than $1\times10^{14}$ atoms/cm$^2$ and equal to or less than $1\times10^{15}$ atoms/cm$^2$.

5. The semiconductor device according to claim 1, further comprising:

an anti-oxidation layer disposed between the first charge storage layer and the dielectric layer, the anti-oxidation layer containing SiCN or SiOCN.

6. The semiconductor device according to claim 5, wherein the anti-oxidation layer has C in SiCN or SiOCN contained in the anti-oxidation layer, the concentration of C being higher on a block insulating layer side than on a tunnel layer side of the anti-oxidation layer.

7. The semiconductor device according to claim 1, wherein the first charge storage layer contains at least one oxynitride of Al, Mo, Nb, Hf, Zr, Ti, B, or P.

8. The semiconductor device according to claim 1, wherein the first charge storage layer contains at least one of Al, Mo, Nb, Hf, Zr, Ti, B, or P at a concentration equal to or more than $1\times10^{19}$ atoms/cm$^2$ and equal to or less than $5\times10^{20}$ atoms/cm$^2$.

9. The semiconductor device according to claim 2, wherein the dielectric layer contains AlOx having a concentration equal to or more than $1\times10^{14}$ atoms/cm$^2$ and equal to or less than $1\times10^{15}$ atoms/cm$^2$.

10. The semiconductor device according to claim 3, further comprising:

an anti-oxidation layer disposed between the first charge storage layer and the dielectric layer, and the anti-oxidation layer containing SiCN or SiOCN, wherein the dielectric layer contains AlOx.

11. The semiconductor device according to claim 1, wherein the second charge storage layer has an N/Si ratio equal to or more than 1.1 and equal to or less than 1.2.

12. A semiconductor device comprising:

a stack including a conductor layer and an insulator layer alternately stacked;

a block insulating layer disposed along a side surface of the stack;

a channel layer;

a charge storage layer disposed between the block insulating layer and the channel layer; and a tunnel layer disposed between the charge storage layer and the channel layer, wherein the charge storage layer includes:

a first charge storage layer containing Si, N and at least one of Al, Mo, Nb, Hf, Zr, Ti, B, or P at a concentration equal to or more than $1\times10^{19}$ atoms/cm$^2$ and equal to or less than $5\times10^{20}$ atoms/cm$^2$, the first charge storage layer having a first N/Si ratio, a second charge storage layer containing Si and N, wherein the second charge storage layer has a second N/Si ratio is smaller than the first N/Si ratio and that is equal to or more than 1.1 and equal to or less than 1.2, and the second charge storage layer disposed between the first charge storage layer and the tunnel layer, and a dielectric layer containing O, the dielectric layer disposed between the first charge storage layer and the second charge storage layer.

13. A manufacturing method of a semiconductor device, the method comprising:

forming a block insulating layer;

forming a first charge storage layer containing Si, N and at least one of Al, Mo, Nb, Hf, Zr, Ti, B, or P along a direction in which the block insulating layer extends, the first charge storage layer having a first Si concentration;

forming a dielectric layer containing O, along the first charge storage layer; and forming a second charge storage layer containing Si and N, the second charge storage layer having a second Si concentration higher than the first Si concentration, along the dielectric layer.

14. The semiconductor device according to claim 1, wherein the conductor layer is formed of tungsten.

15. The semiconductor device according to claim 1, wherein the insulator layer is formed of silicon oxide.

16. The semiconductor device according to claim 1, wherein the block insulating layer is formed of at least one of silicon oxide or aluminum oxide.

17. The semiconductor device according to claim 1, wherein the channel layer is formed of a semiconductor material.

18. The semiconductor device according to claim 1, wherein the tunnel layer is formed of at least one of silicon oxide, silicon oxide and silicon nitride, or silicon oxynitride.

* * * * *